(12) United States Patent
Regef et al.

(10) Patent No.: US 11,187,752 B2
(45) Date of Patent: Nov. 30, 2021

(54) BATTERY LEAK TEST DEVICE AND METHODS

(71) Applicant: ATEQ Corporation, Livonia, MI (US)

(72) Inventors: Jean Luc Regef, Taipei (TW); Guy D. Dewailly, White Bluff, TN (US)

(73) Assignee: ATEQ Corporation, Livonia, MI (US)

( * ) Notice: Subject to any disclaimer, the term of this patent is extended or adjusted under 35 U.S.C. 154(b) by 89 days.

(21) Appl. No.: 16/556,395

(22) Filed: Aug. 30, 2019

(65) Prior Publication Data

US 2020/0072907 A1 Mar. 5, 2020

Related U.S. Application Data

(60) Provisional application No. 62/773,344, filed on Nov. 30, 2018, provisional application No. 62/754,973, filed on Nov. 2, 2018, provisional application No. 62/728,920, filed on Sep. 10, 2018, provisional application No. 62/725,688, filed on Aug. 31, 2018.

(51) Int. Cl.
   *G01R 31/382* (2019.01)
   *G01R 31/392* (2019.01)

(52) U.S. Cl.
   CPC ......... *G01R 31/382* (2019.01); *G01R 31/392* (2019.01)

(58) Field of Classification Search
   None
   See application file for complete search history.

(56) References Cited

U.S. PATENT DOCUMENTS

| | | | | |
|---|---|---|---|---|
| 4,954,087 A * | 9/1990 | Lauks | ............... | G01R 1/07357 174/51 |
| 5,111,137 A * | 5/1992 | Heumann | ............... | G01R 31/52 324/763.01 |
| 5,206,097 A * | 4/1993 | Burns | ............... | G01R 31/3648 429/90 |
| 6,033,233 A * | 3/2000 | Haseyama | ......... | G01R 1/06722 439/66 |
| 2002/0008534 A1* | 1/2002 | Yamazaki | ......... | G01R 31/2863 324/750.03 |
| 2005/0151456 A1* | 7/2005 | Yoon | .................... | H01J 1/3042 313/311 |
| 2008/0018355 A1* | 1/2008 | Takekoshi | ........... | G01R 31/286 324/750.03 |
| 2008/0258737 A1* | 10/2008 | Aihara | ................. | G01R 31/346 324/557 |
| 2009/0095095 A1* | 4/2009 | Hayashi | ............ | H01L 21/68735 73/865.8 |

(Continued)

FOREIGN PATENT DOCUMENTS

DE   10 2012 214738 A1   2/2014
DE   10 2014 205918 A1   10/2015

*Primary Examiner* — Jas A Sanghera
(74) *Attorney, Agent, or Firm* — Young Basile Hanlon & MacFarlane, P.C.

(57) ABSTRACT

A testing device and method may be implemented for improved detection of leaks in batteries used in portable electronic devices. The leak testing device may include a chamber configured to hold a device under test. The chamber may include a conductive foam, a conductive liquid, or any suitable conductive material. The chamber may be configured to hold the device under test in a substantially airtight environment and prevent or reduce air ionization under high voltage. The device under test may be a battery that has a conductive outer layer.

30 Claims, 16 Drawing Sheets

(56) References Cited

U.S. PATENT DOCUMENTS

2014/0239962 A1* 8/2014 Oda .................. H01M 8/04582
324/426
2018/0026313 A1 1/2018 Fukuoka et al.

* cited by examiner

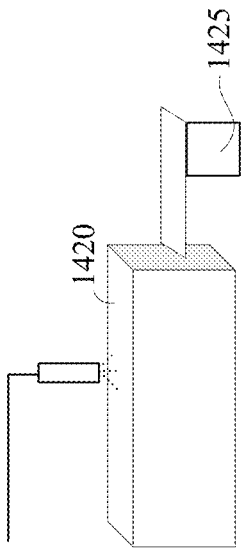
FIG. 14B
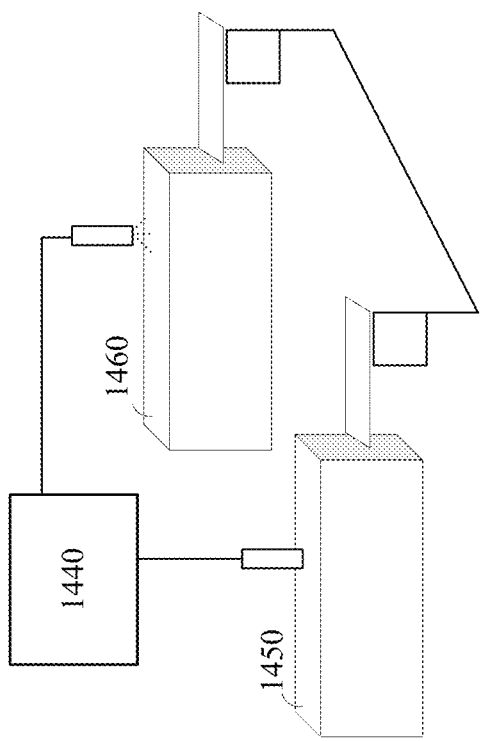
FIG. 14D
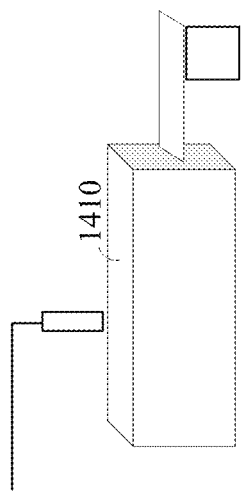
FIG. 14A
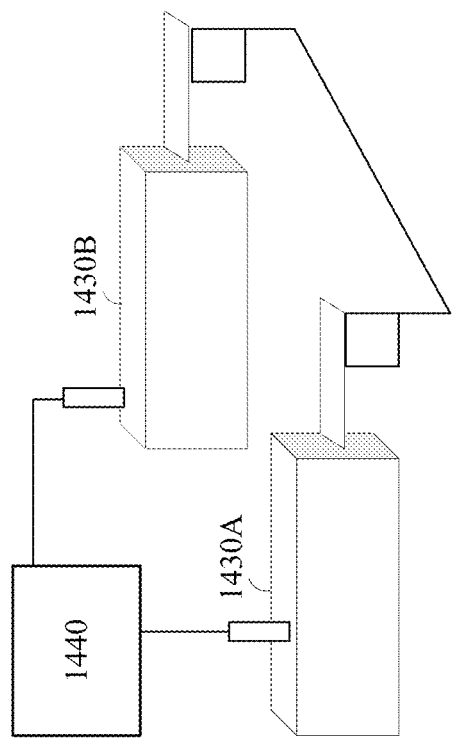
FIG. 14C
FIG. 14

BATTERY LEAK TEST DEVICE AND METHODS

CROSS-REFERENCE TO RELATED APPLICATIONS

This application claims priority to and the benefit of U.S. Provisional Patent Application No. 62/725,688, filed Aug. 31, 2018, U.S. Provisional Patent Application No. 62/728,920, filed Sep. 10, 2018, U.S. Provisional Patent Application No. 62/754,973, filed Nov. 2, 2018, and U.S. Provisional Patent Application No. 62/773,344, filed Nov. 30, 2018, the entire disclosures of which are hereby incorporated by reference.

TECHNICAL FIELD

This disclosure generally relates to the field of battery testing devices and methods. The invention has particular, and non-exclusive, use with batteries that have a conductive outer layer.

BACKGROUND

Typical 12 volt (V) automotive batteries have plastic housings. The plastic housings are tested for leaks using high voltage electrodes inside the plastic housing and ground electrodes outside the plastic housing.

A new challenge is presented in the case of portable electronics, for example mobile phones. The batteries used in portable electronics are covered with a conductive film on the exterior surface. The conductive film conducts electricity and may have anti-static properties.

Typical leak test methods, for example using tracer gas charging, or volatile organic compound detection or air pressure change, have limitations. For example, since the battery is completely sealed and there is no empty space inside, a leak cannot create a pressure change, and the component does not absorb tracer gas through the leak. In addition, any fluid that has leaked would dry up and seal the hole, and therefore the leak would be undetected. In addition, the fluids inside the battery do not reject a significant amount of volatile organic compounds. Typical leak test methods with high voltage electricity are challenged by the conductive nature of the anti-static film on the exterior surface of the battery. For example, even a battery with no defect leaks so much electricity through the anti-static film that it is impossible to differentiate a battery with a defect from a battery with no defect.

SUMMARY

Disclosed herein is a test instrument and method for improved detecting of leaks in batteries used in portable electronic devices. In an aspect, a leak test instrument may include a test chamber. The leak test instrument may include at least one power source. The power source may be configured to apply a voltage to one or more electrodes. The leak test instrument may include a pressure source. The pressure source may be configured to apply a pressure to a part under test. The part under test may be located in a test chamber. The pressure source may apply the pressure prior to a testing sequence. The leak test instrument may include a current measuring device. The current measuring device may be configured to measure current on at least one electrode to detect a leak.

In one or more aspects, at least one of the electrodes may not be in contact with the part under test. In one or more aspects, the at least one of the electrodes may be in contact with the part under test via a conductive element. In one or more aspects, the conductive element may comprise an elastic part. In one or more aspects, the conductive element may be a conductive foam, a spring, or both. In one or more aspects, the conductive element may be configured to hold the part under test in a housing. In one or more aspects, the pressure source may be a pressure regulator, a device applying a mechanical force on the part under test, or both. In one or more aspects, the vacuum may be applied to aid propagation of ions between the one or more electrodes and the part under test. In one or more aspects, an additional conductive portion may be under a tension. The tension may be substantially equal to one of the electrodes. In one or more aspects, an insulating portion may be configured to allow a cable of the part under test to pass through. A metal contact may be configured to be electrically coupled to the cable under testing conditions and a ground. In one or more aspects, the insulating portion may include rubber or a non-conductive material that provides greater insulation than air. In one or more aspects, an ultraviolet (UV) lamp may be configured to radiate between at least one of the electrodes and the part under test. In one or more aspects, the part under test may be an electric storage device, a part comprising a breathable membrane, or an insulated film. In one or more aspects, the breathable membrane may be gas permeable, impervious to liquid, or both.

In an aspect, a method may include applying a first voltage to a first electrode. The method may include applying a second voltage to a second electrode. The method may include measuring as current on at least one electrode. The method may include determining a defect of a part under test based on the current measurement of the at least one electrode.

In one or more aspects, the first electrode may be in contact with the part under test via a conductive element. In one or more aspects, the second electrode may not be in contact with the part under test. In one or more aspects, the method may include applying UV light between at least one electrode and the part under test. In one or more aspects, the method may include contacting the first and second electrodes to ground to remove static electricity.

BRIEF DESCRIPTION OF THE DRAWINGS

The invention is best understood from the following detailed description when read in conjunction with the accompanying drawings. It is emphasized that, according to common practice, the various features of the drawings are not to-scale. On the contrary, the dimensions of the various features are arbitrarily expanded or reduced for clarity.

FIGS. 14A and 14B are diagrams of a typical ionized air leak test.

FIGS. 14C and 14D are diagrams of comparison ionized air leak tests in accordance with embodiments of this disclosure.

DETAILED DESCRIPTION

Figure 1:
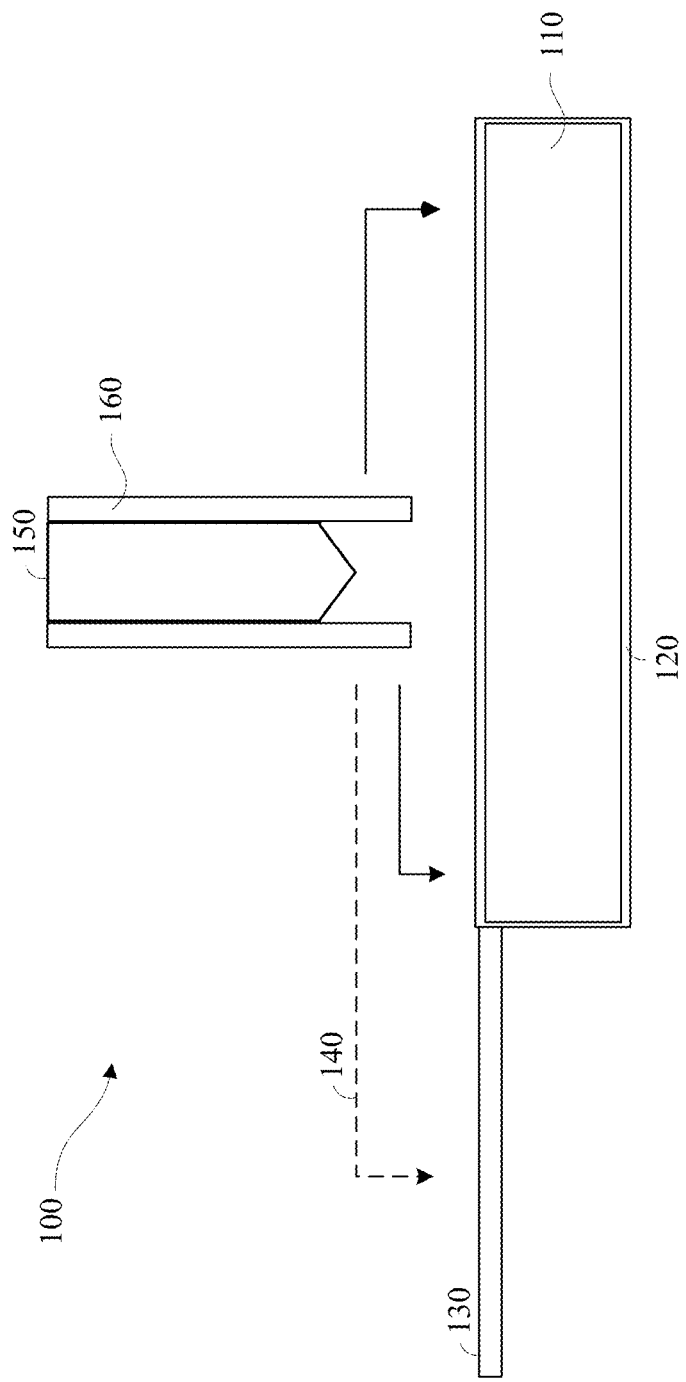
FIG. 1 is a diagram of an example of a leak test using a high voltage.

Disclosed herein is a testing device and method for improved detecting of leaks in batteries used in portable electronic devices. In an aspect, a leak testing device may include a chamber configured to hold a device under test. The chamber may include a conductive element such as a conductive foam, a conductive liquid, soft carbon fiber brush, or any suitable conductive material. The conductive element may be configured to hold the device under test. Non-conductive material may surround the conductive element and may be used to prevent or reduce air ionization under high voltage. In some examples, a conductive material may surround the conductive element and may be used to prevent or reduce air ionization under high voltage. For example, a conductive layer may be coupled to the conductive element. The conductive layer may be configured to contact the device under test. The conductive layer may be a flexible conductive material. The conductive layer may be, for example, aluminum foil or conductive mesh. In some embodiments, the conductive element and the conductive layer may be replaced with a liquid or gel filled pouch where the liquid or gel and the pouch are made of conductive materials.

The leak test device may include a first high voltage portion coupled to the conductive element via a first metal contact. The first high voltage portion may be energized at a test high voltage. The test high voltage may be 1000 volts or less if there is a flat contact, or the test high voltage may be 1000 volts or more if there is a non-flat contact or no contact. A second high voltage portion may be coupled to the conductive element. The second high voltage portion may have a different source than the first high voltage portion. In some implementations, the leak test device may include a resistor configured to limit the current on the first high voltage portion, the second high voltage portion, or both, to protect the conductive element and maintain enough current to detect leaks. The resistor may be adjusted depending on the testing application. The device under test may be a battery that has a conductive outer layer. The device under test may be an electric storage device, including, for example, a capacitor.

An insulating portion may be configured to allow a cable or electrode of the device under test to passthrough while sealing the chamber. The insulating portion is comprised of rubber or any other suitable insulating material. Under testing conditions, a second metal contact may be configured to be electrically coupled to the cable or electrode and a ground.

In an aspect, a leak test instrument may include a pressure regulator, a vacuum regulator, a vacuum pump, a power source, one or more valves, and a pressure sensor. The pressure regulator may be configured to apply a positive pressure to a test chamber with an inert gas prior to a testing sequence. The vacuum regulator and vacuum pump may be configured to apply a vacuum to the test chamber during the testing sequence. The power source may be configured to apply a voltage to one or more electrodes of the test chamber.

A method for testing a leak in a battery may include applying air pressure to a test chamber prior to a test sequence. The method may include applying a vacuum to the test chamber during the test sequence. The method may include applying a first voltage to a first electrode. The method may include applying a second voltage to a second electrode. The method may include measuring a current on the first electrode. The method may include measuring a current on the second electrode. The method may include determining a leak result based on the first measurement and the second measurement.

In one or more aspects, a leak testing instrument may include a low voltage electrode, a current limiter, and a microprocessor. The microprocessor may be configured to control an ultraviolet (UV) lamp for air ionization. In one or more aspects, a method for detecting a leak may include ionizing ambient air in a test chamber by ionizing oxygen in the air with voltage and UV light. In one or more aspects, a method for detecting a leak may include ionizing ambient air in a test chamber by ionizing oxygen using UV light, and reading, with a low voltage, an electric current flowing through the ionized air to detect a leak. In one or more aspects, at least one electrode may be in contact with the device under test by a conductive foam where vacuum, UV, or both are not needed. In one or more aspects, the electrodes may not be in contact. In one or more aspects, vacuum, UV, or both may be used to limit the used test tension. In one or more aspects, applying a force by an elastic conductive element may provide a suitable electrical contact, and for a battery, draw electrolyte out of a defect.

FIG. 1 is a diagram of an example of a leak test 100 performed on battery 110. As shown in FIG. 1, the exterior surface of the battery 110 is encased in a conductive film 120. The conductive film 120 may be referred to as the conductive outer layer. The battery 110 includes an electrode 130 that is coupled to ground. The electrode 130 is coupled to a detector (not shown) that is configured to measure energy leaks in the form of unwanted electron movement 140 on the surface of a battery without defects, and a current through the battery if the battery has a leak. In this example, a probe 150 is used to test the surface of the battery 110 for energy leaks by ionizing the air above the surface of the battery 110. A user may hover the probe 150 over the surface of the battery 110 and measure unwanted electron movement 140 via the detector (not shown). The entire surface of the battery 110 may be scanned using the probe 150 to detect energy leaks. In some examples, the probe may include a sheath 160. The sheath 160 may be made of plastic or any suitable non-conductive material and configured to prevent the probe from contacting or damaging the conductive film 120. The sheath 160 may also be used to contact the surface of the battery 110 to maintain a uniform height over the surface of the battery 110 while scanning. The probe 150 may be a high voltage needle probe. In some examples, the probe 150 may be energized at 6 Kilovolts.

Figure 2:
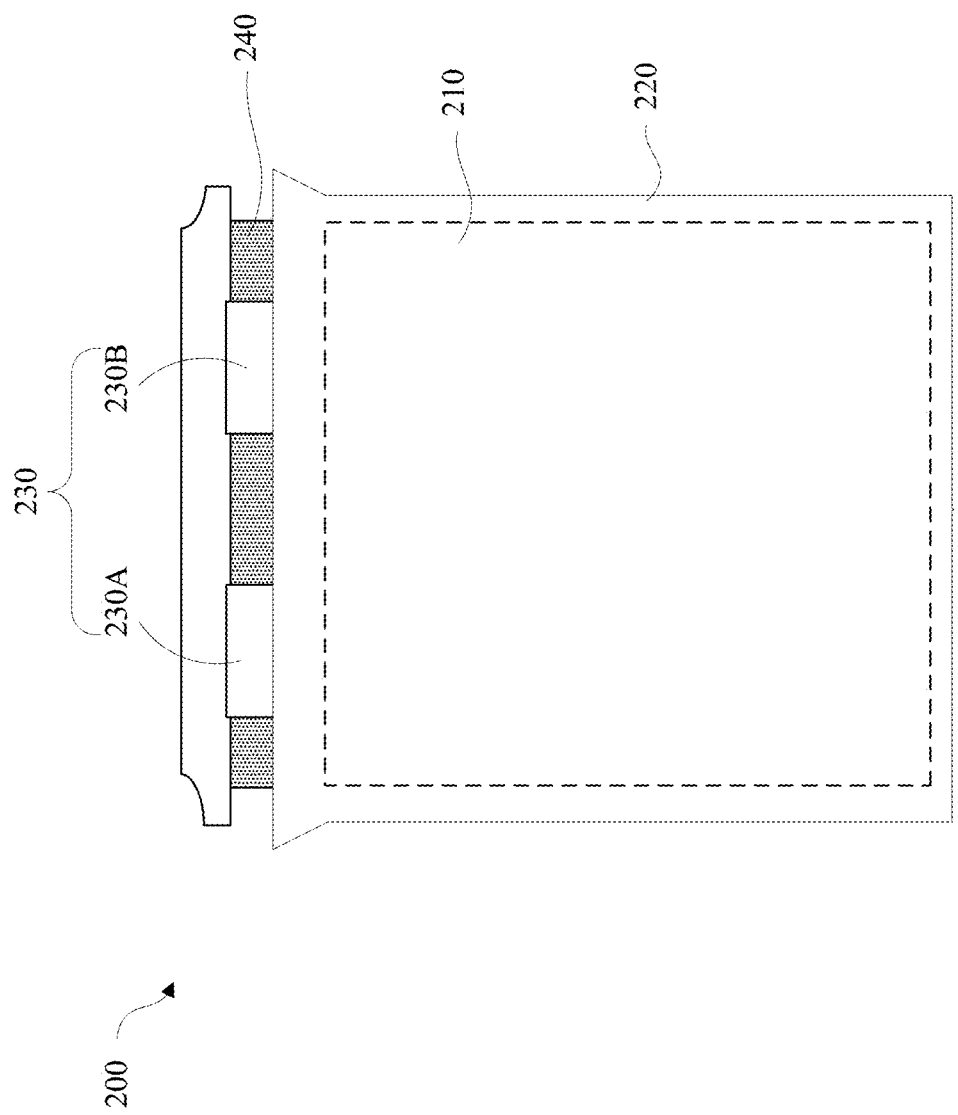
FIG. 2 is a diagram of an example of a typical battery for use with a portable electronic device.

FIG. 2 is a diagram of an example of a typical battery cell 200 for use with a portable electronic device. As shown in FIG. 2, a battery 210 is encased in a conductive film 220. The battery 210 is shown in dashed lines because it is not visible when encased in the conductive film 220. The battery 210 includes a positive contact 230A and a negative contact 230B. The positive contact 230A and the negative contact 230B may collectively be referred to as contacts 230. The battery 210 includes an insulation layer 240 shown in stippling. The insulation layer 240 may be in the form of a sheet that is in contact with the contacts 230.

A typical high voltage test focuses on the electric insulation of the high voltage electrode to prevent the high voltage electrode from having electrical current leaks to the ground. Referring to FIG. 2, the distance gap between the exposed part of the contacts 230 and the conductive film 220 is very short. The short distance gap causes air to become conductive at high voltage since the test requires that either the positive contact 230A or the negative contact 230B is connected to the ground.

In order to avoid concern of current leaks through the conductive film 220 of a battery 210 that has no defect, it would be desirable to have a test device that does not allow the current to leak from the conductive film 220 during the test. It would also be desirable to have a test device that allows the conductive film 220 to be charged with a high voltage during the test while not allowing discharge to the ground and creating a current.

Figure 3:
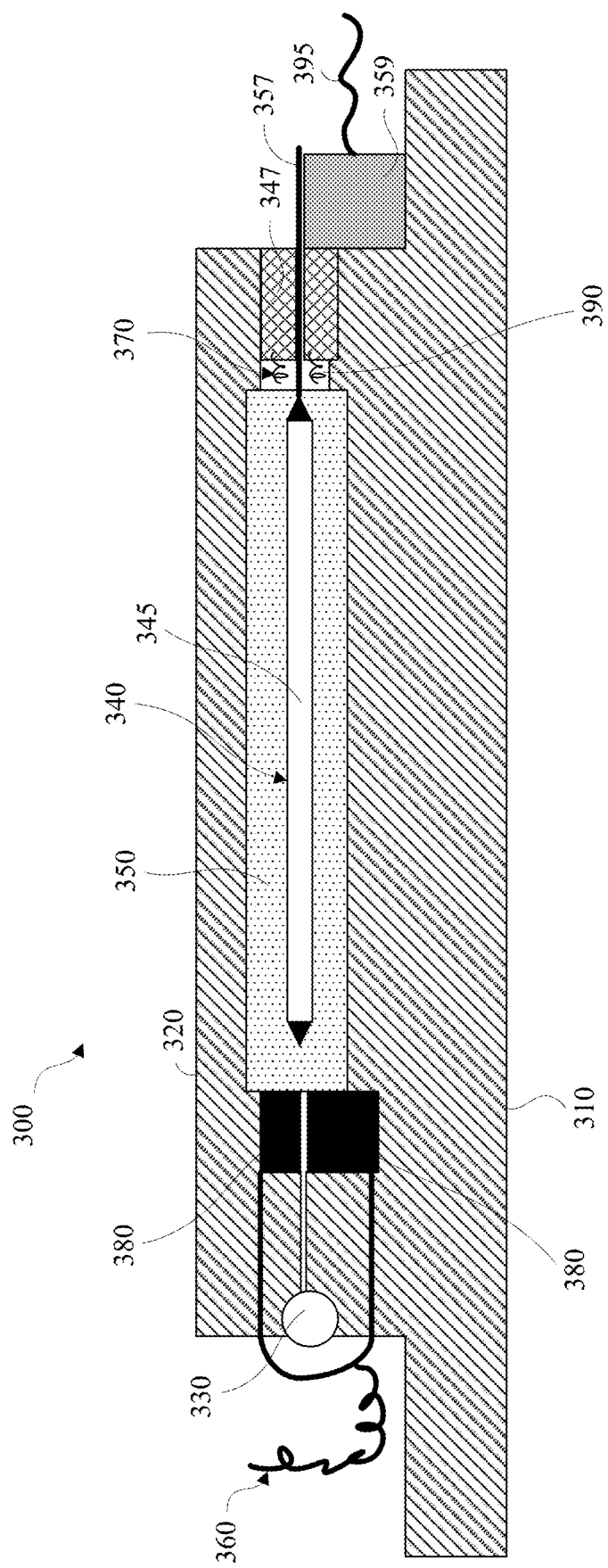
FIG. 3 is a diagram of an example of a leak test device in accordance with an embodiment of this disclosure.

FIG. 3 is a diagram of an example of a leak test device 300 in accordance with an embodiment of this disclosure. The leak test device 300 is configured to test a device at a voltage that does not conduct a significant amount of electricity through the gap, for example, a voltage lower than 3000 volts.

The leak test device 300 includes a base 310 and a lid 320 connected by a hinge 330. When the lid 320 is closed, it forms an inner chamber 340 that is configured to hold a device under test, for example, a mobile device battery 345. The base 310 and the lid 320 are constructed of a non-conductive material, and may be, for example, constructed of plastic. The base 310 and the lid 320 each include an insulating rubber portion 347, shown in cross-hatching, that is configured to seal the inner chamber 340 when the lid 320 is closed. The lid 320 may be closed via a clamp or a weight. The inner chamber 340 is lined with a conductive element 350, shown in stippling, that is configured to hold the device under test such that the conductive element 350 is in contact with all surfaces of the device under test. The conductive element 350 may be a conductive foam or equivalent. In some examples, the conductive element 350 may be replaced with a conductive liquid. In an example, a pressure of approximately 12 kg may be applied to the conductive foam or equivalent.

The battery 345 that has a flat battery cable 357. Under testing conditions, the battery 345 is placed in the inner chamber 340 such that the flat battery cable 357 extends outside the inner chamber 340 via the insulating rubber portion 347, and is in contact with a metal contact 359.

The leak test device 300 includes a first high voltage portion 360 and a second high voltage portion 370. The first high voltage portion 360 is the test high voltage, and is used to energize the conductive element 350 via a pair of metal contacts 380. The test high voltage may be any voltage below 3000 volts. The second high voltage portion 370 has a different source than the first high voltage portion 360. The second high voltage portion 370 is used to energize a tungsten wire 390. The tungsten wire 390 may not be in contact with the conductive element 350 and the insulating rubber portion 347. In some implementations, the tungsten wire 390 may be in contact with the base 310, the lid 320, or both. The second high voltage portion 370 has the same voltage amount as the first high voltage portion 360. The second high voltage portion 370 is configured to prevent any electron traveling from the conductive element 350 to a ground 395 through the air. As shown in FIG. 3, the ground 395 is connected to the metal contact 359.

In some implementations, one or more resistors may be used to control or limit the current on the first high voltage portion 360, the second high voltage portion 370, or both, to protect the conductive element 350, and still have enough current to detect leaks. The current reduction may be used for operator safety if needed, protect the test fixture, and may prevent excessive ozone generation. Under testing conditions, the ground 395 is coupled to a detector (not shown). A high current reading from the first high voltage portion 360 to the ground 395 indicates the presence of a leak in the battery 345. A low current reading from the first high voltage portion 360 to the ground 395 indicates that there is no leak present in the battery 345.

Figure 4:
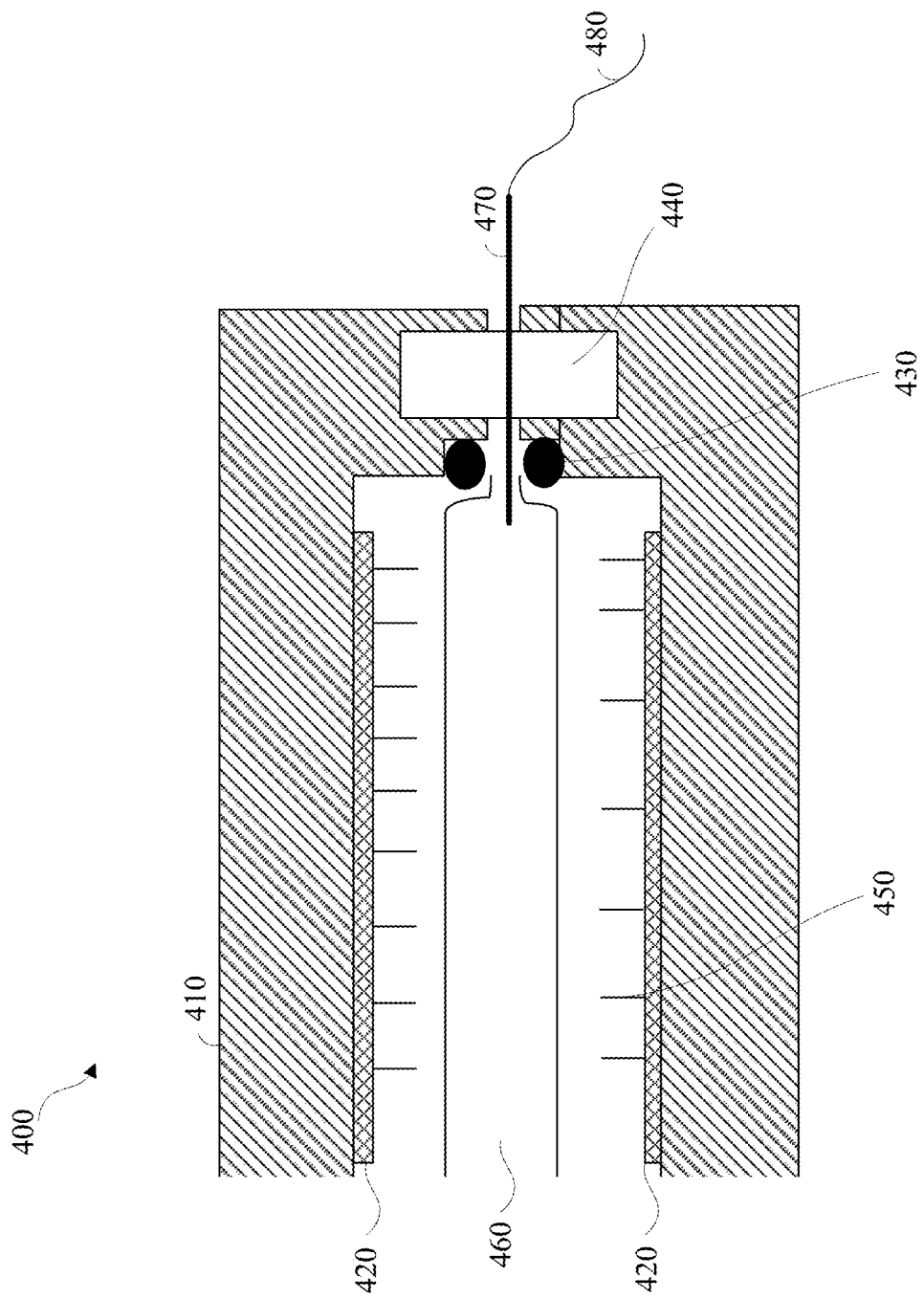
FIG. 4 is a diagram of another example of a leak test device in accordance with an embodiment.

FIG. 4 is a diagram of another example of a leak test device 400 in accordance with an embodiment of this disclosure. One advantage of this example is that high voltage can be used to ionize the air, and there is no need for a conductive foam that may wear out after multiple tests are performed. The leak test device 400 includes an outer casing 410, first high voltage electrodes 420, second high voltage electrodes 430, and an insulating rubber portion 440. In this example, the first high voltage electrodes 420 include ionization spikes 450 where leak current measurements are taken. The second high voltage electrodes 430 are at the same voltage as the first high voltage electrodes 420, and are not in the measurement circuit. The outer casing 410 may be made of any suitable material such as plastic, Teflon, or a combination thereof, and may be any color, for example, white.

The leak test device 400 is configured to hold a battery 460. The battery 460 may have a conductive surface. Under testing conditions, a negative electrode 470 of the battery 460 extends through the insulating rubber portion 440 via the second high voltage electrode 430. The negative electrode 470 may be connected to a ground 480. The ground 480 is connected to a detector (not shown).

The second high voltage electrodes 430 may be approximately the shape of the positive electrode and negative electrode 470 of the battery 460. The second high voltage electrodes 430 may be located in the gap between the positive and negative electrodes of the battery 460 and the conductive outer layer of the battery 460. Under testing conditions, the second high voltage electrodes 430 are powered with the same voltage as the first high voltage electrodes 420, and are not part of the test circuit. Since electrons need a difference of potential to move, and if the proximity of the battery electrodes are already at test voltage, no electrons can flow between the conductive outer layer of the battery and the battery electrodes and ground. Accordingly, the second high voltage electrodes 430 act as a barrier between the first high voltage electrodes 420 and the ground. The second high voltage electrodes 430 will leak electricity to the ground, however this leak will not be measured.

Figure 5:
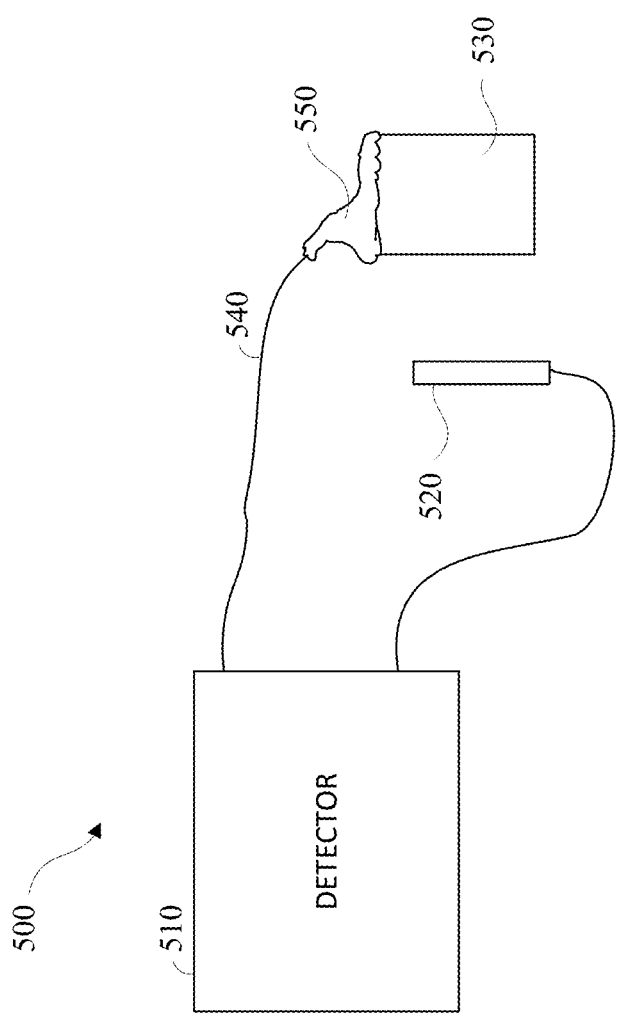
FIG. 5 is a diagram of an example of a leak test system in accordance with an embodiment.

FIG. 5 is a diagram of an example of a leak test system 500 in accordance with an embodiment of this disclosure. In this example, the leak test system 500 includes a detector 510 and a probe 520. The detector 510 may be an ATEQ Ioniq instrument or any other suitable device. The probe 520 may include a sheath to protect the surface of the device under test from damage. The device under test may be a battery 530.

As shown in FIG. 5, under testing conditions, the battery 530 is coupled to ground 540. An electrically insulating material 550 is used to cover the positive and negative contacts of the battery 530 to further insulate the contacts from the conductive layer that wraps the battery 530. The electrically insulating material may be any suitable material that is more insulating than air alone. For example, when the contacts are covered with a non-conductive putty, the high voltage test is possible since the whole outer layer of the battery 530 can reach a high voltage without flowing electric current to the ground 540. In some embodiments, the battery 530 may be placed on an insulating foam during testing conditions. The insulating foam may be a plastic foam or any other suitable material.

Figure 6:
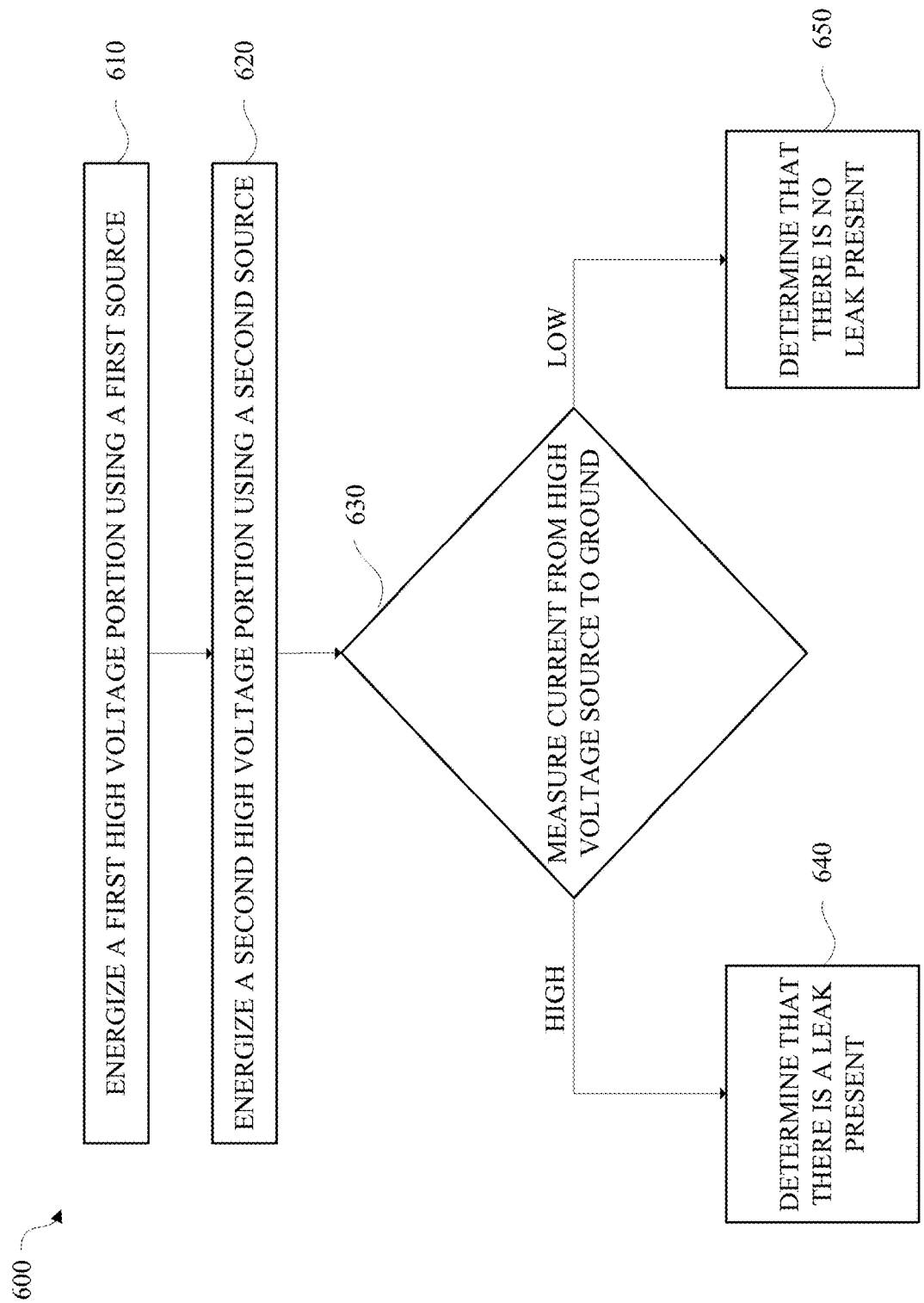
FIG. 6 is a diagram of an example a method to perform a leak test in accordance with an embodiment.

FIG. 6 is a diagram of an example a method 600 to perform a leak test in accordance with an embodiment of this disclosure. A device under test is placed in the testing apparatus. The device under test may be a battery that has an outer conductive layer. When placed inside the testing device, a contact from the battery extends outside the testing apparatus and is connected to the ground. The ground is electrically coupled to a detector to measure the voltage and determine if there is a leak present.

The method 600 includes energizing 610 a first high voltage portion using a first source. The method 600 also includes energizing 620 a second high voltage portion using a second source. The second source is different than the first source and provides the same voltage and amount as the first source.

The method 600 includes measuring 630 a current from a high voltage source to the ground. On a condition that the measured current is high, the testing apparatus determines 640 that there is a leak present. On a condition that the measured current is low, the testing apparatus determines 650 that there is no leak present.

Figure 7:
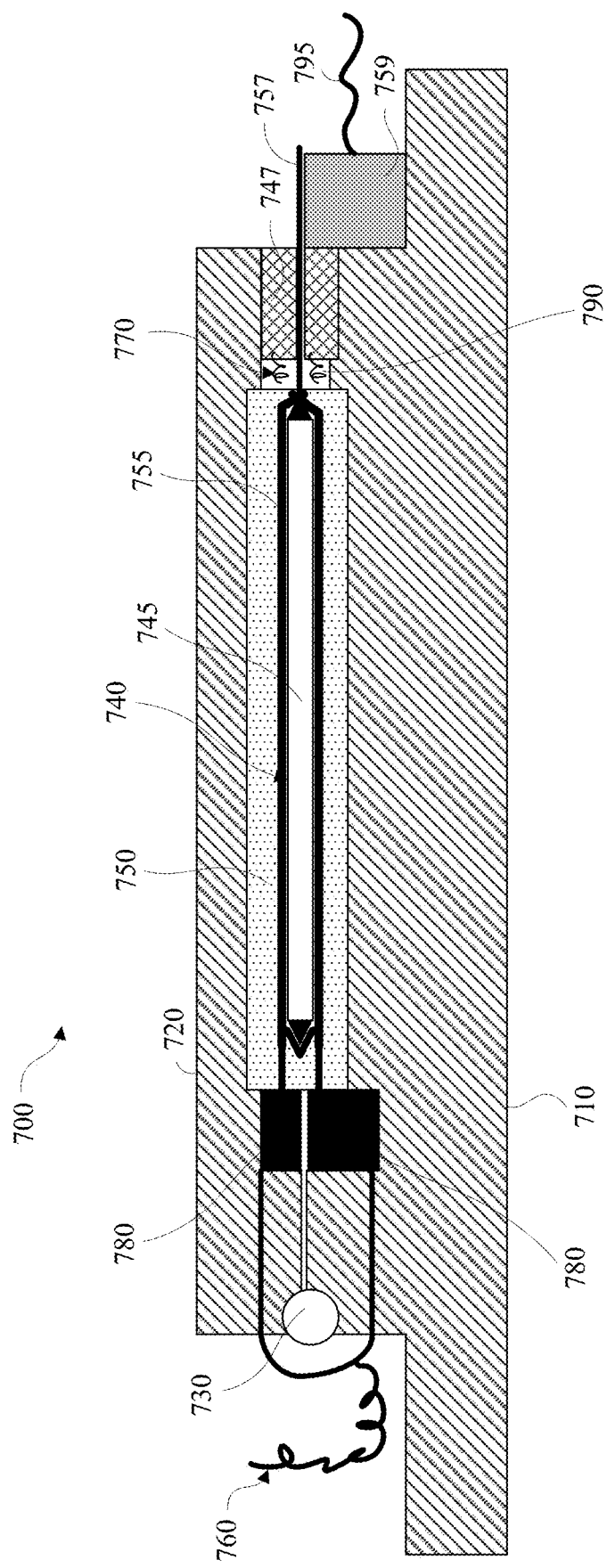
FIG. 7 is a diagram of another example of a leak test device in accordance with an embodiment.

FIG. 7 is a diagram of another example of a leak test device 700 in accordance with an embodiment of this disclosure. The leak test device 700 is configured to test a device at a voltage that does not conduct a significant amount of electricity through the gap, for example, a voltage lower than 3000 volts.

The leak test device 700 includes a base 710 and a lid 720 connected by a hinge 730. When the lid 720 is closed, it forms an inner chamber 740 that is configured to hold a device under test, for example, a mobile device battery 745. The base 710 and the lid 720 are constructed of a non-conductive material, and may be, for example, constructed of plastic. The base 710 and the lid 720 each include an insulating rubber portion 747, shown in cross-hatching, that is configured to seal the inner chamber 740 when the lid 720 is closed. The lid 720 may be closed via a clamp or a weight. The inner chamber 740 is lined with a conductive element 750, shown in stippling, that is configured to hold the device under test. The conductive element 750 may be a conductive foam or equivalent. In an example, approximately 12 kg of pressure may be applied to the conductive foam or equivalent. In some examples, the conductive element 750 may be replaced with a conductive liquid. In this example, the conductive element 750 includes a conductive layer 755 that is in contact with all surfaces of the device under test. The conductive layer 755 may be configured to conduct electricity for the test and protect the conductive element 750. The conductive layer 755 may be configured to prevent contact of the conductive element 750 with air and protect the conductive element 750 against wear and tear. In addition, the conductive layer 755 may be configured to protect the conductive element 750 against liquid leaks from the battery. The conductive layer 755 may be made of any suitable flexible conductive material, for example, aluminum foil, tin foil, or the like.

The battery 745 that has a flat battery cable 757. Under testing conditions, the battery 745 is placed in the inner chamber 740 such that the flat battery cable 757 extends outside the inner chamber 740 via the insulating rubber portion 747, and is in contact with a metal contact 759.

The leak test device 700 includes a first high voltage portion 760 and a second high voltage portion 770. The first high voltage portion 760 is the test high voltage, and is used to energize the conductive element 750 via a pair of metal contacts 780. As shown in FIG. 7, the conductive layer 755 is in contact with the metal contacts 780. The test high voltage may be any voltage below 3000 volts. The second high voltage portion 770 has a different source than the first high voltage portion 760. The second high voltage portion 770 is used to energize a tungsten wire 790. The tungsten wire 790 may not be in contact with the conductive element 750 and the insulating rubber portion 747. In some implementations, the tungsten wire 790 may be in contact with the base 710, the lid 720, or both. The second high voltage portion 770 has the same voltage amount as the first high voltage portion 760. The second high voltage portion 770 is configured to prevent any electron traveling from the conductive element 750 to a ground 795 through the air. As shown in FIG. 7, the ground 795 is connected to the metal contact 759.

In some implementations, one or more resistors may be used to control or limit the current on the first high voltage portion 760, the second high voltage portion 770, or both, to protect the conductive element 750, and still have enough current to detect leaks. Under testing conditions, the ground 795 is coupled to a detector (not shown). A high current reading from the first high voltage portion 760 to the ground 795 indicates the presence of a leak in the battery 745. A low current reading from the first high voltage portion 760 to the ground 795 indicates that there is no leak present in the battery 745.

The use of a vacuum under test conditions may increase the range of detection. For example, a vacuum chamber that provides a partial vacuum may allow a longer travel distance for oxygen ions for the same voltage. In an example, a vacuum of 90 kPa may be used for a contact electrode and a vacuum of 1.5 kPa may be used for a non-contact electrode. In an example, a protective layer of a battery may not be conductive at a low voltage, and may become conductive on the surface when submitted to a high voltage. In some testing scenarios, a partial defect in the battery may not generate a leak during testing, and may generate a leak due to corrosion in the future. Using a high voltage may pierce through the partial defect, however, in some scenarios, a glue seam in the folds of the protective covering may hide the defect. In an example, 200V may be directly applied on the surface of a battery through a conductive foam, and 400V may be applied with an array of needles (i.e., non-contact electrodes). The array of needles may be approximately 0.5 mm from the surface of the battery. The embodiments disclosed herein may be used to detect a partial defect when hidden by the glue seam.

As the air density (i.e., pressure) in the testing chamber increases, the shorter the mean free path:

$$\lambda = k \cdot T^2 / (\sqrt{2\pi d_m^2}) / P \qquad \text{Equation (1)}$$

As the mean free path is increased in the vacuum, the ionized oxygen molecules may flow more easily. Accordingly, leaks may be detected more easily.

In some testing scenarios, the device under test itself may be damaged by too much vacuum. Accordingly, an optimal pressure may be determined based on the device under test. For example, a device under test that has little liquid electrolyte may have an optimal pressure that differs from an optimal pressure for a device under test that does not contain liquid electrolyte. In an example, a vacuum may be used to pump fresh electrolyte to the leak path, making it more conductive and easier to detect a leak. For example, the vacuum may pull electrolyte out of a defect in the battery to aid movement of ionized oxygen molecules.

Figure 8:
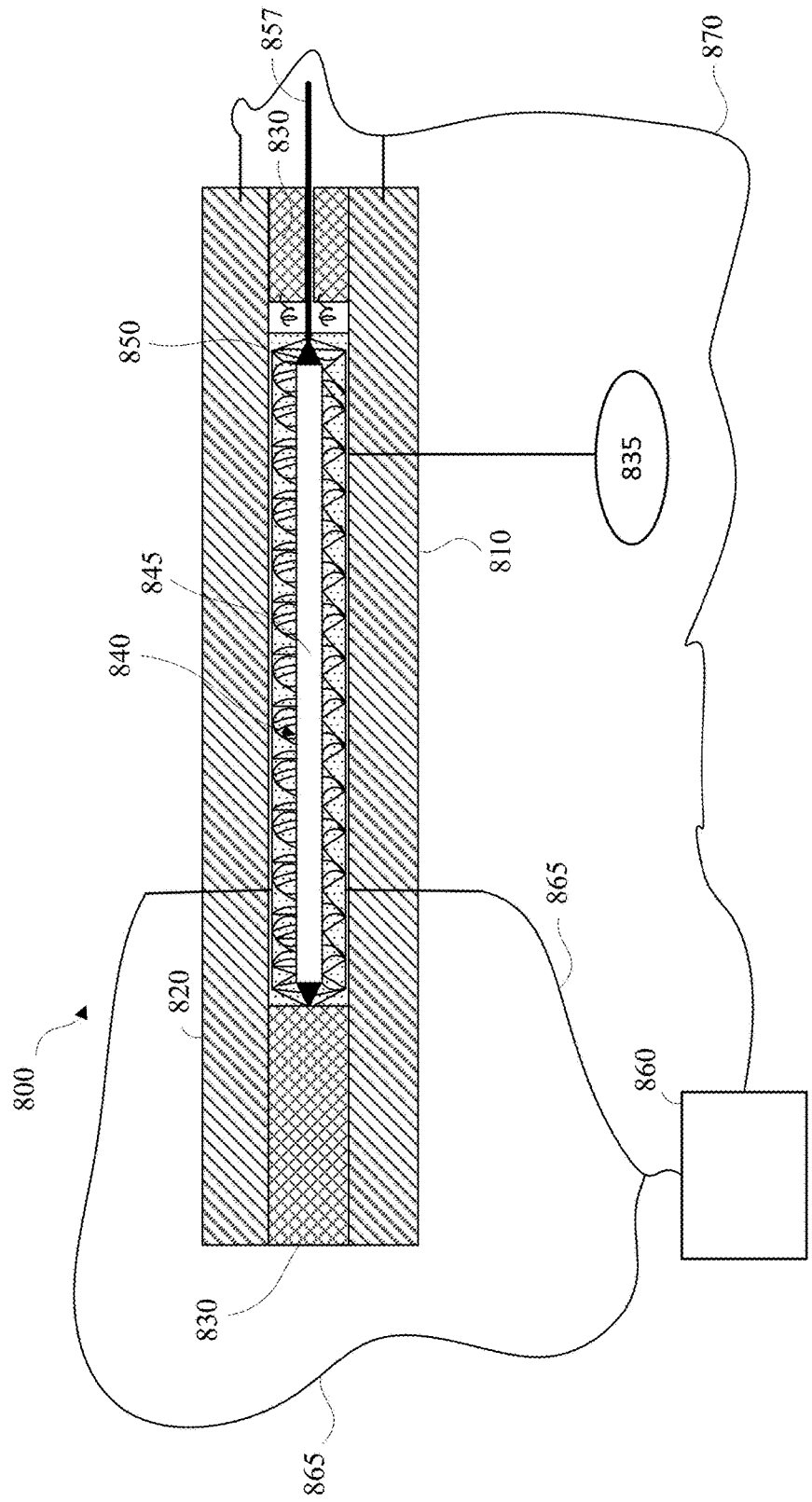
FIG. 8 is a diagram of another example of a leak test device in accordance with an embodiment.

FIG. 8 is a diagram of another example of a leak test device 800 in accordance with an embodiment of this disclosure. The leak test device 800 is configured to test a device at a voltage that does not conduct a significant amount of electricity, for example, a voltage greater than 1000 volts.

The leak test device 800 includes a base 810 and a lid 820. When the lid 820 is closed, it forms an inner chamber 840, shown in stippling, that is configured to hold a device under test, for example, a mobile device battery 845. The battery 845 may include a protective covering. The protective covering may be a film or a pouch, and may include one or more folds. A fold in the protective covering may be obstructed by a glue seam. Typical leak test devices may not be configured to detect a leak in a fold in the protective covering of the battery 845, or a leak that is obstructed by a glue seam. The leak test device 800 is configured to detect leaks in a fold in the protective covering of the battery 845, or a leak that is obstructed by a glue seam.

The base 810 and the lid 820 are constructed of a non-conductive material, and may be, for example, constructed of plastic. The base 810 and the lid 820 each include a dampener 830, shown in cross-hatching, that is configured to seal the inner chamber 840 when the lid 820 is closed. The dampener 830 may be an elastomer material. The lid 820 may be closed via a clamp or a weight. A vacuum source 835 may create a vacuum in the inner chamber 840. The vacuum may be a partial vacuum, for example up to approximately 10 kPa. The leak test device 800 includes brushes 850 that are electrically coupled to a high voltage source 860 that is configured to generate a first high voltage 865. The brushes 850 may be carbon fiber brushes, and may be close to or in contact with one or more folds in the protective covering of the battery 845. The brushes 850 may be soft and configured to ionize the oxygen that is very close to the potential defect area without harming the battery 845. The brushes 850 may improve leak detection by providing a shorter distance between high voltage and the ground. In some testing scenarios, a leak may exist on the side of the battery 845 in the folds of the protective covering, making the leak difficult to detect. The brushes 850 may be used to detect a leak that is present in the folds of the protective covering of the battery 845 that would otherwise be undetectable. A partial vacuum may aid the ions to travel more freely to reach the defect. In some testing scenarios, a high voltage may be sufficient to pierce a hole in the glue seam if it hides a defect.

The battery 845 may have a flat battery cable 857. Under testing conditions, the battery 845 is placed in the inner chamber 840 such that the flat battery cable 857 extends outside the inner chamber 840, and is connected to ground (not shown).

The leak test device 800 includes a first high voltage portion 865 and a second high voltage portion 870. The first high voltage portion 865 is the test high voltage, and is used to energize the brushes 850. The test high voltage may be any voltage below 3000 volts. The second high voltage portion 870 may have a different source than the first high voltage portion 865. The second high voltage portion 870 is used to energize base 810 and the lid 820. In an example, the second high voltage portion 870 may have the same voltage amount as the first high voltage portion 865. The second high voltage portion 870 is configured to prevent any electron traveling from the brushes 850 to a ground (not shown) through the air. The second high voltage portion 870 may not be in the measurement circuit.

In some implementations, one or more resistors may be used to control or limit the current on the first high voltage portion 865, the second high voltage portion 870, or both, to protect the brushes 850, and still have enough current to detect leaks. Under testing conditions, the ground is coupled to a detector (not shown). A high current reading from the first high voltage portion 865 to the ground indicates the presence of a leak in the battery 845. A low current reading from the first high voltage portion 865 to the ground indicates that there is no leak present in the battery 845.

Figure 9:
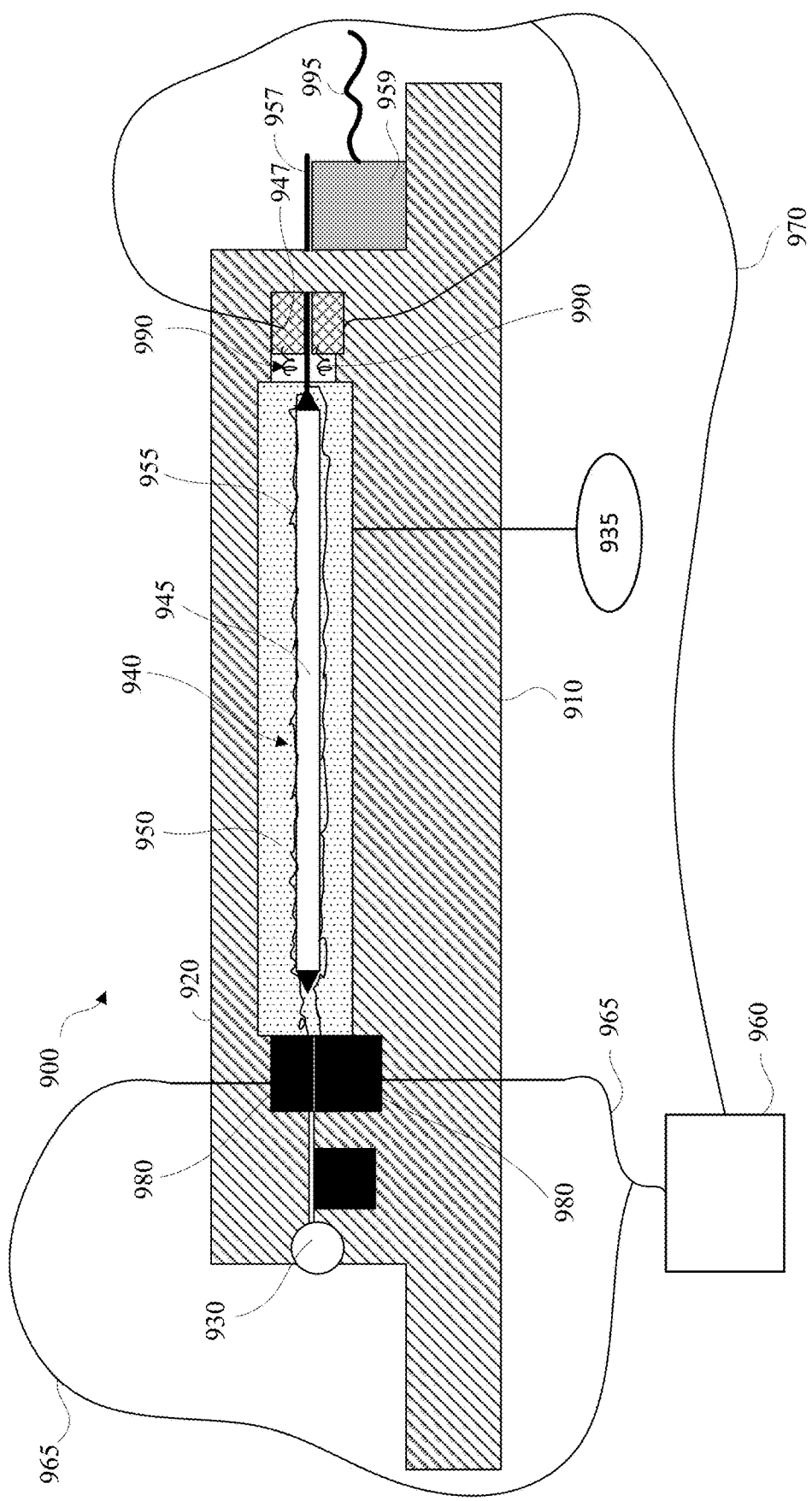
FIG. 9 is a diagram of another example of a leak test device in accordance with an embodiment.

FIG. 9 is a diagram of an example of a leak test device 900 in accordance with an embodiment of this disclosure. The leak test device 900 is configured to test a device at a voltage that does not conduct a significant amount of electricity, for example, a voltage greater than 1000 volts.

The leak test device 900 includes a base 910 and a lid 920 connected by a hinge 930. When the lid 920 is closed, it forms an inner chamber 940 that is configured to hold a device under test, for example, a mobile device battery 945. In this example, battery 945 may be a battery that has little or no electrolytes. The base 910 and the lid 920 are constructed of a non-conductive material, and may be, for example, constructed of plastic. The base 910 and the lid 920 each include an insulating rubber portion 947, shown in cross-hatching, that is configured to seal the inner chamber 940 when the lid 920 is closed. The lid 920 may be closed via a clamp or a weight. A vacuum source 935 may create a vacuum in the inner chamber 940. The vacuum may be a partial vacuum, for example up to approximately 10 kPa. The leak test device 900 includes a wire mesh layer 955 that is electrically coupled to a high voltage source 960 that is configured to generate a first high voltage 965. In an example, the wire mesh layer 955 may be used to test a battery that has low electrolyte or no electrolyte. The wires of the wire mesh layer 955 may create sharp edges that provide a "corona" ionization (e.g., air ionization) compared to a flat conductive material. The metallic mesh layer may be flexible to provide contact with the surface of the battery.

The inner chamber 940 is lined with a conductive element 950, shown in stippling, that is configured to hold the device under test such that the conductive element 950 is in contact with all surfaces of the device under test. The conductive element 950 may be a conductive foam or equivalent. In an example, approximately 12 kg of pressure may be applied to the conductive foam or equivalent. In some examples, the conductive element 950 may be replaced with a conductive liquid. The leak test device 900 may include a wire mesh layer 955 that is in contact with the conductive element 950 and the battery 945. The wire mesh layer 955 includes mesh elements that that are configured to ionize the air. A partial vacuum may aid the ions to travel more freely to reach the defect in the battery 945.

The battery 945 has a flat battery cable 957. Under testing conditions, the battery 945 is placed in the inner chamber 940 such that the flat battery cable 957 extends outside the inner chamber 940 via the insulating rubber portion 947, and is in contact with a metal contact 959.

The leak test device 900 includes a first high voltage portion 965 and a second high voltage portion 970. The first high voltage portion 965 is the test high voltage, and is used to energize the wire mesh layer 955 via a pair of metal contacts 980. The test high voltage may be 1000 volts or more. The second high voltage portion 970 may have a different source than the first high voltage portion 965. The second high voltage portion 970 is used to energize a tungsten wire 990. In an example, the tungsten wire 990 may not be in contact with the wire mesh layer 955, the insulating rubber portion 947, or both. In some implementations, the tungsten wire 990 may be in contact with the base 910, the lid 920, or both. The second high voltage portion 970 has the same voltage amount as the first high voltage portion 965. The second high voltage portion 970 is configured to prevent any electron traveling from the wire mesh layer 955 to a ground 995 through the air. As shown in FIG. 9, the ground 995 is connected to the metal contact 959.

In some implementations, one or more resistors may be used to control or limit the current on the first high voltage portion 965, the second high voltage portion 970, or both, to protect the conductive element 950, and still have enough current to detect leaks. Under testing conditions, the ground 995 is coupled to a detector (not shown). A high current reading from the first high voltage portion 965 to the ground 995 indicates the presence of a leak in the battery 945. A low current reading from the first high voltage portion 965 to the ground 995 indicates that there is no leak present in the battery 945.

Figure 10:
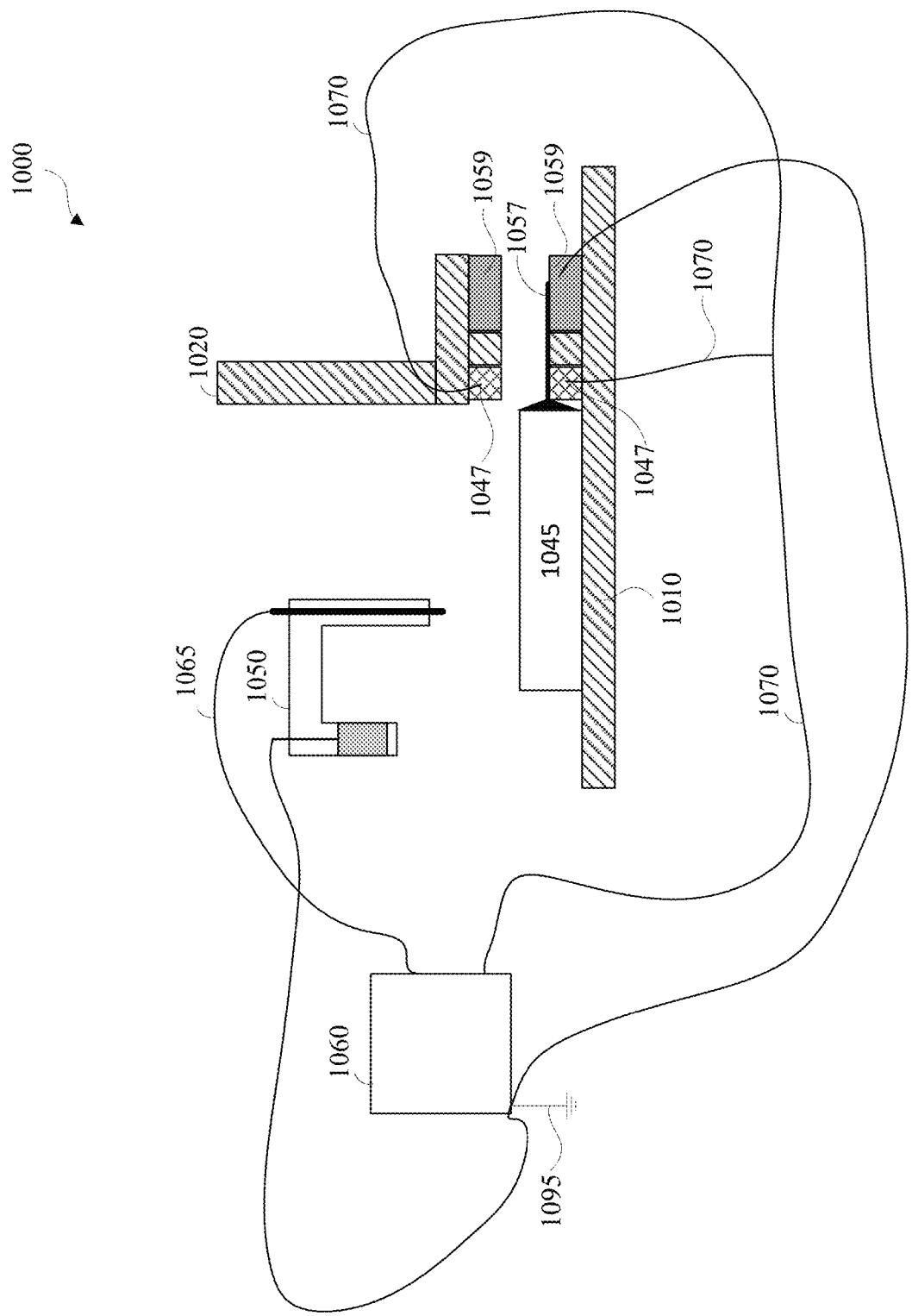
FIG. 10 is a diagram of another example of a leak test device in accordance with an embodiment.

FIG. 10 is a diagram of another example of a leak test device 1000 in accordance with an embodiment of this disclosure. The leak test device 1000 is configured to test a device at a voltage that does not conduct a significant amount of electricity, for example, a voltage greater than 1000 volts.

The leak test device 1000 includes a base 1010 and an arm 1020. The base 1010 is configured to hold a device under test, for example, a mobile device battery 1045. The base 1010 and the arm 1020 are constructed of a non-conductive material, and may be, for example, constructed of plastic or a Teflon material. The base 1010 and the arm 1020 each include an insulating rubber portion 1047, shown in cross-hatching. The arm 1020 may be configured to move up and down and to clamp the device under test to prevent movement.

The battery 1045 that has a flat battery cable 1057. Under testing conditions, the battery 1045 is placed on the base 1010 such that the flat battery cable 1057 extends over the insulating rubber portion 1047, and is in contact with a metal contact 1059.

In this example, a probe 1050 is used to test the surface of the battery 1045 for energy leaks by ionizing the air above the surface of the battery 1045. As shown in FIG. 10, the probe 1050 may be configured with a handle that is connected to the ground 1095. The probe may be configured to connect the operator to the ground to prevent electric voltage build up on the operator. A user may hover the probe 1050 over the surface of the battery 1045 and measure unwanted electron movement via the detector 1060. The entire surface of the battery 1045 may be scanned using the probe 1050 to detect energy leaks. In some examples, the probe 1050 may include a needle and a sheath. The sheath may be made of plastic or any suitable non-conductive material and configured to prevent the probe from contacting or damaging the conductive film of the battery 1045. The sheath may also be used to contact the surface of the battery 1045 to maintain a uniform height over the surface of the battery 1045 while scanning. The probe 1050 may be a high voltage needle probe. In some examples, the probe 1050 may be energized at 6 Kilovolts.

The leak test device 1000 includes a first high voltage portion 1065 and a second high voltage portion 1070. The first high voltage portion 1065 is the test high voltage, and is used to energize the probe 1050. The test high voltage may be any voltage above 3000 volts. The second high voltage portion 1070 may have a different source than the first high voltage portion 1065. The second high voltage portion 1070 may have the same voltage amount as the first high voltage portion 1065. As shown in FIG. 10, the ground 1095 is connected to the metal contact 1059.

In the implementations described herein, one or more resistors may be used to control or limit the current on the first high voltage portion 1065, the second high voltage portion 1070, or both. Under testing conditions, the ground 1095 is coupled to a detector 1060. A high current reading from the first high voltage portion 1065 to the ground 1095 indicates the presence of a leak in the battery 1045. A low current reading from the first high voltage portion 1065 to the ground 1095 indicates that there is no leak present in the battery 1045.

Some leak testing devices may use high voltage to ionize oxygen molecules. Some ultraviolet (UV) light may be used to ionize oxygen molecules or to excite the oxygen molecules to a state where they may be more easily ionized with high voltage. The UV light used to ionize the oxygen molecules may be a short wavelength UV light.

In some scenarios, using high voltage may damage the device under test. With the use of UV light, a leak test ionizing oxygen molecules may be performed under lower voltage. The UV wavelengths may be in the UVC range. Methods using UV light to ionize or excite oxygen molecules may performed without the use of a tracer gas, thereby providing an economical solution. The electric current measured for the methods using UV light may be small, therefore an abundant amount of oxygen may not be necessary to perform the test. Another benefit is that these methods produce little to no ozone.

In some examples, it may be possible to ionize oxygen with voltage using pulses of higher voltage and a steady lower voltage afterwards to move the ionized oxygen towards the leak path instead of using a high voltage direct current. In some examples, a vacuum may be used to aid the propagation of ionization in air by increasing the mean free path of molecules. For example, a vacuum of around 2 KPa may be used.

Figure 11:
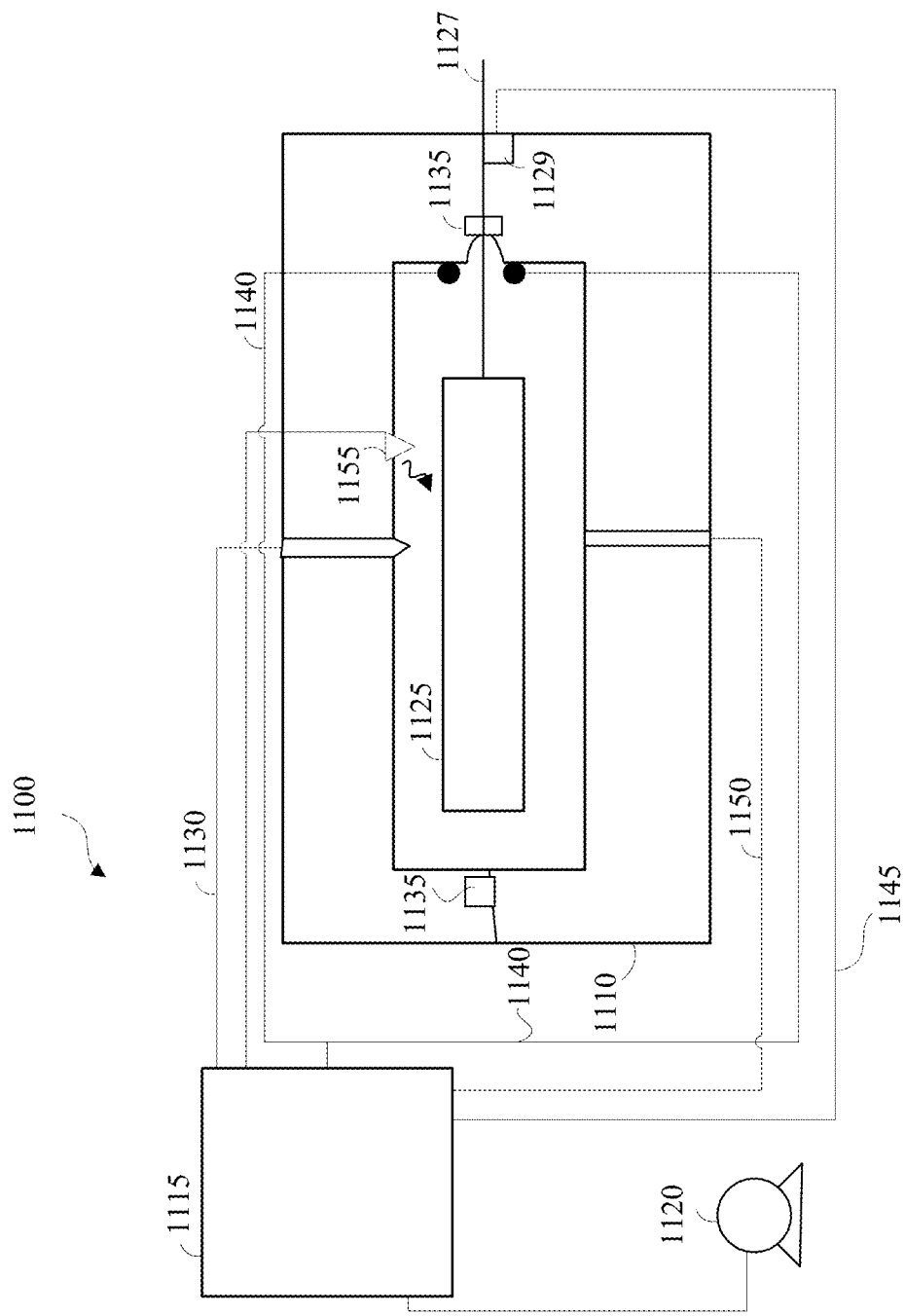
FIG. 11 is a diagram of another example of a leak test system in accordance with an embodiment.

FIG. 11 is a diagram of another example of a leak test system 1100 in accordance with an embodiment of this disclosure. The leak test system 1100 includes a test fixture 1110, a microprocessor controlled instrument 1115, and a vacuum source 1120. The leak test fixture 1110 includes a test chamber that is configured to hold a device under test 1125. In this example, the device under test 1125 may be a pouch type battery having contacts 1127 that are in contact with a ground metal contact 1129. The pouch type battery may be semi-flexible. In an example, the device under test 1125 may not be in contact with the high voltage electrode 1130. The high voltage electrode 1130 is part of the test circuit, and may have, for example, a voltage of 500 volts DC. The leak test fixture 1110 may be constructed of a non-conductive material, for example, plastic, and include a non-conductive elastomer seal 1135.

The leak test system 1100 includes a high voltage portion 1140 that is not in the test circuit. The electrodes for the high voltage portion 1140 may include current limitation resistors. The leak test system 1100 includes a zero (0) volt or ground circuit 1145. The leak test system 1100 includes a vacuum line 1150 that regulates and controls the vacuum in the test chamber and a UV lamp 1155. The UV lamp 1155 may be in the line of sight of the high voltage electrode 1130. The UV lamp 1155 may be configured with a switch (not shown) that turns on the UV lamp only when the test fixture 1110 is closed.

The microprocessor controlled instrument 1115 is configured to energize the high voltage electrode 1130, the vacuum source 1120, the high voltage electrode 1140, and the UV lamp 1155. The instrument 1115 is configured to regulate the amount of vacuum supplied to the test chamber and monitor the level of vacuum in the test chamber. When the appropriate level of vacuum is reached, the instrument initiates measurement of the current on the high voltage electrode 1130. The instrument 1115 then determines if the part being tested passes or fails based on the amount of current measured. The instrument 1115 then stops the vacuum source 1120, and equalizes the testing chamber pressure with atmospheric pressure. The instrument 1115 then turns off the UV light and the high voltage 1130. In some embodiments, the high voltage electrode 1130 may be multiple electrodes, or a carbon brush that is configured to cover the surface of the device under test 1125. A multiple electrode configuration may include multiple pointed electrodes.

Figure 12:
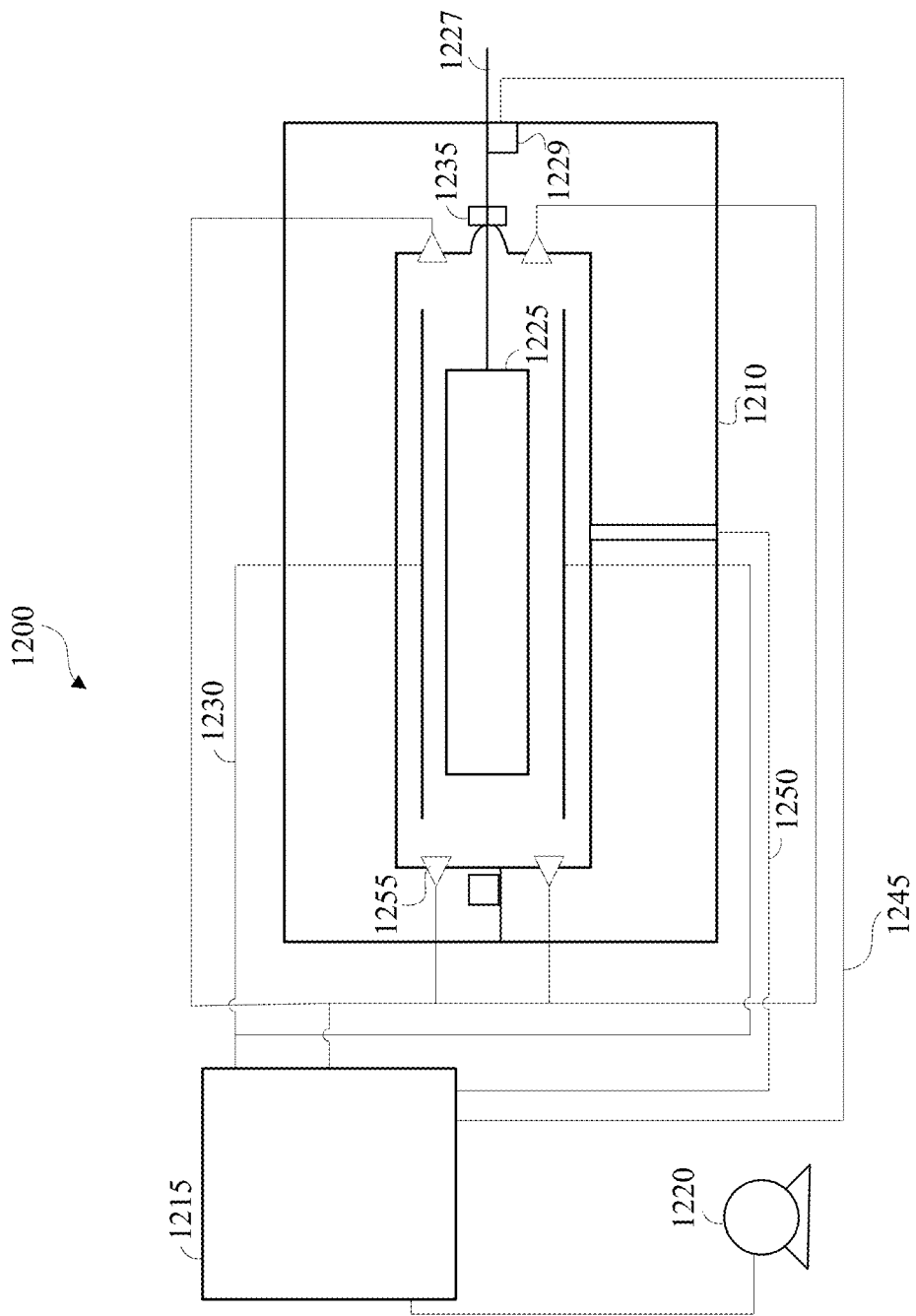
FIG. 12 is a diagram of another example of a leak test system in accordance with an embodiment.

FIG. 12 is a diagram of another example of a leak test system 1200 in accordance with an embodiment of this disclosure. In this example, oxygen molecules may be ionized by UV light using a low voltage to perform a leak test. The leak test system 1200 includes a test fixture 1210, a microprocessor controlled instrument 1215, and a vacuum source 1220. The leak test fixture 1210 includes a test chamber that is configured to hold a device under test 1225. In this example, the device under test 1225 may be a pouch type battery having contacts 1227 that are in contact with a ground metal contact 1229. The pouch type battery may be semi-flexible. In an example, the device under test 1225 may not be in contact with test output electrode 1230. The test output electrode 1230 is part of the test circuit, and may have, for example, a voltage of positive 12 volts. The leak test fixture 1210 may be constructed of a non-conductive material, for example, plastic, and include a non-conductive elastomer seal 1235.

The leak test system 1200 includes a zero (0) volt or ground circuit 1245. The leak test system 1200 includes a vacuum line 1250 that regulates and controls the vacuum in the test chamber and one or more UV lamps 1255. In this example, four (4) UV lamps are shown. The UV lamps 1255 may be in the line of sight of the test output electrode 1230. The UV lamps 1255 may be configured with a switch (not shown) that turns on the UV lamp only when the test fixture 1210 is closed.

The microprocessor controlled instrument 1215 is configured to energize the test output electrode 1230, the vacuum source 1220, and the UV lamp 1255. The instrument 1215 is configured to regulate the amount of vacuum supplied to the test chamber and monitor the level of vacuum in the test chamber. When the appropriate level of vacuum is reached, the instrument initiates measurement of the current on the test output 1230. The instrument 1215 then determines if the part being tested passes or fails based on the amount of current measured. The instrument 1215 then stops the vacuum source 1220, and equalizes the testing chamber pressure with atmospheric pressure. The instrument 1215 then turns off the UV light and the test output electrode 1230. In some embodiments, the test output electrode 1230 may be multiple electrodes, or a carbon brush that is configured to cover the surface of the device under test 1225. A multiple electrode configuration may include multiple pointed electrodes.

Figure 13:
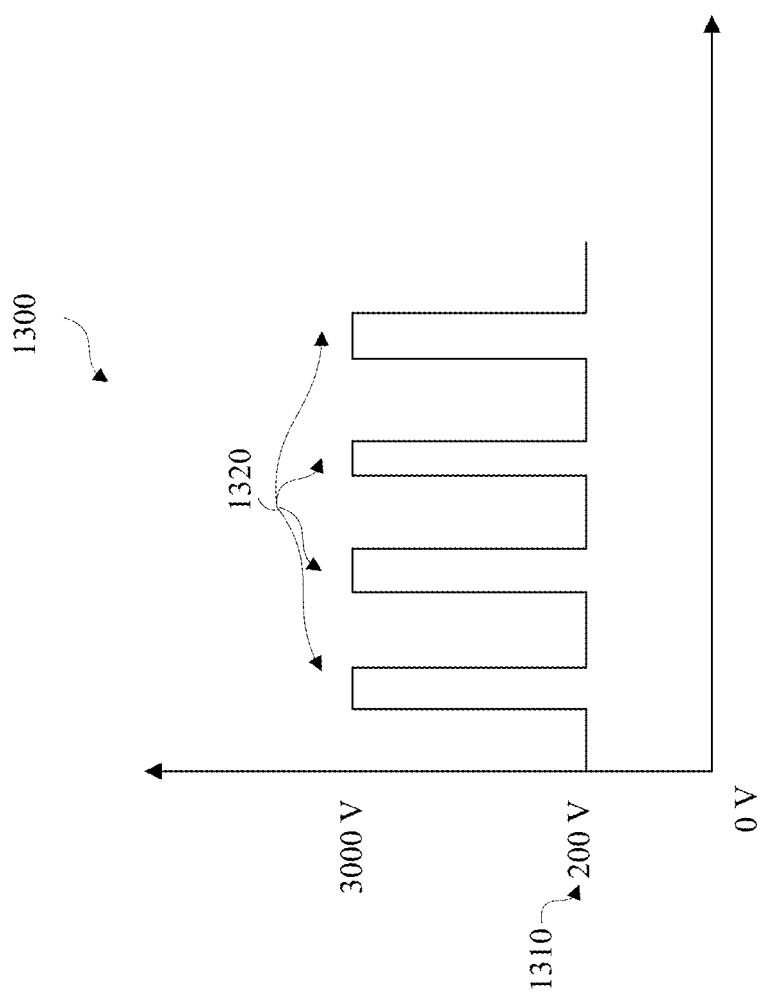
FIG. 13 is a graph showing example ionization spikes during a leak test in accordance with an embodiment.

FIG. 13 is a graph showing example ionization spikes 1300 during a leak test in accordance with an embodiment of this disclosure. In this example, the leak detection does not require a constant application of high voltage. Accordingly, the test may be performed using a lower voltage 1310 and pulsing at a higher voltage 1320. For example, a constant ionization at 3000 V may not be necessary. The testing may be performed at 200 V and a few pulses or spikes at 3000 V to ionize air may be sufficient to ionize the oxygen molecules. This method may be prevent damage to the device under test.

Variability of atmospheric air may affect the measurement of ionized air leak testers. Variation of the atmospheric air may be caused by humidity. The presence of water vapor in the air makes more air susceptible to ionization. Air pollution by solvents or other ionizable molecules may affect the testing. On standard pure dry air, an instrument may ionize oxygen molecules to make the air conductive, typically using high voltage. If there is a defect in the part being tested, an electric current may flow through the defect and may be measured by the instrument. An advantage of ionized air leak testing is that it uses free atmospheric air, however a weakness is that ambient air is variable.

FIGS. 14A and 14B are diagrams of a typical ionized air leak test. FIG. 14A shows a known good battery 1410 that records a current of 20 nA through the air during testing. The current flows to the ground connection of the battery or any other grounded conductive surface of the test device. FIG. 14 B shows a battery 1420 with a leak where the instrument records a current of 80 nA because ionized air flows to the battery electrolyte connected to the ground 1425, since the electrolyte is exposed through a defect in the battery coating. The flow of ionized air is shown in dots.

FIGS. 14C and 14D are diagrams of comparison ionized air leak tests in accordance with embodiments of this disclosure. FIG. 14 C shows two non-leaking batteries 1430A and 1430B of the same type being tested at the same time using the same instrument 1440. The instrument 1440 records a current of 20 nA on both batteries, and displays a difference of 0 nA. FIG. 14 D shows one known non-leaking battery as a reference battery 1450 and a battery under test 1460 with a leak is tested at the same time on the same test fixture 1440. The reference side records a value of 20 nA and the test side records a value of 80 nA. The instrument 1440 displays the difference of 60 nA by subtracting the reference battery reading from the battery under test reading.

Figure 15:
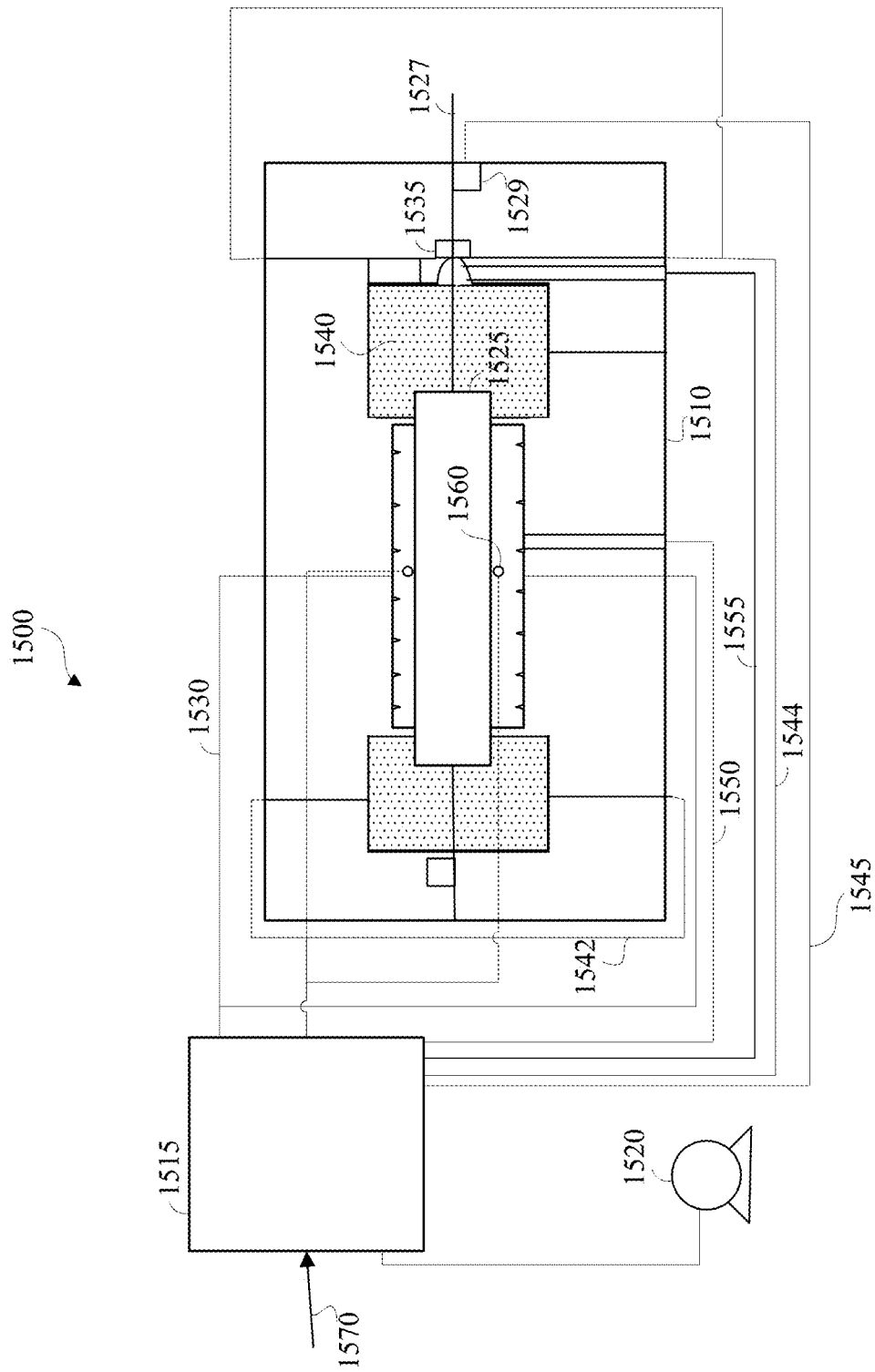
FIG. 15 is a diagram of another example of a leak test system in accordance with an embodiment.

FIG. 15 is a diagram of another example of a leak test system 1500 in accordance with an embodiment of this disclosure. In this example, a portion of the device under test may be in contact with a conductive element, and another portion of the device under test may be free from contact with a conductive element. The leak test system 1500 may be configured to apply pressure to squeeze electrolyte out of the device under test. For example, the leak test system 1500 may be configured to apply pressure, such as air pressure (or any inert gas), prior to the test and then apply a vacuum during the test.

The leak test system 1500 includes a test fixture 1510, a microprocessor controlled instrument 1515, and a vacuum source 1520. The microprocessor controlled instrument 1515 may have three channels including UV, pressure, and vacuum. The microprocessor controlled instrument 1515 may include a vacuum regulator, a pressure regulator, valves, and pressure sensors. The leak test fixture 1510 includes a test chamber that is configured to hold a device under test 1525. In this example, the device under test 1525 may be a pouch type battery having contacts 1527 that are in contact with a ground metal contact 1529. The pouch type battery may be semi-flexible. As shown in FIG. 15, a portion of the device under test 1525 may not be in contact with test output electrode 1530. The test output electrode 1530 is part of the test circuit, and may be a high voltage electrode. A portion of the device under test 1525 may be in contact with a conductive element 1540 shown in stippling. A second test output electrode 1542 is connected to the conductive element 1540 and is part of the test circuit. The second test output electrode 1542 may be a high voltage electrode. A third test output electrode 1544 may be a barrier electrode that is not part of the test circuit. The third test output electrode 1544 may be a high voltage electrode, and may have the same voltage as the first test output electrode 1530, the second test output electrode 1542, or both. The voltage of the third test output electrode may be dependent upon the layout of the test fixture 1510. For example, the voltage of the third test output electrode 1544 may be based on its proximity to the first test output electrode 1530, the second test output electrode 1542, or both. In an example, no current measurement is made on the third test output electrode 1544. The test output electrodes 1530, 1542, 1544 may be energized independently during testing so as not to interfere with a test performed on another portion of the device under test 1525. Each of the test output electrodes 1530, 1542, 1544 may apply the same voltage or different voltages. The leak test fixture 1510 may be constructed of a non-conductive material, for example, plastic, and include a non-conductive elastomer seal 1535.

The leak test system 1500 includes a zero (0) volt or ground circuit 1545. The leak test system 1500 includes a first and second inlet/outlet line 1550, 1555 that regulate and control the pressure/vacuum in the test chamber and one or more UV lamps 1560. The pressure may be applied in a center portion of the test chamber of the leak test system 1500 and not in the surrounding area on the other side of the conductive element 1540 such that there is a difference of pressure between the two areas to aid in pushing electrolyte out of the device under test. In this example, two (2) UV lamps are shown. The UV lamps 1560 may be in the line of sight of the test output electrode 1530. The UV lamps 1560 may be configured to emit a wavelength that promotes the ionization of air. The UV lamps 1560 may be configured with a switch (not shown) that turns on the UV lamp only when the test fixture 1510 is closed.

The microprocessor controlled instrument 1515 is configured to energize the test output electrode 1530, the second test output electrode, 1542, the third test output electrode 1544, the vacuum source 1520, the UV lamp 1560, and a valve 1570 to control regulated pressure. The instrument 1515 is configured to regulate the amount of pressure/vacuum supplied to the test chamber and monitor the level of pressure/vacuum in the test chamber. When the appropriate level of vacuum is reached, the instrument initiates measurement of the current on the test output electrode 1530, second test output electrode 1542, or both. The instrument 1515 then determines if the part being tested passes or fails based on the amount of current measured. The instrument 1515 then stops the vacuum source 1520, and equalizes the testing chamber pressure with atmospheric pressure. The instrument 1515 then turns off the UV light and the test output electrode 1530, second test output electrode 1542, and third test output electrode 1544. In some embodiments, the test output electrodes may be a carbon brush that is configured to cover the surface of the device under test 1525. A multiple electrode configuration may include multiple pointed electrodes, as shown in FIG. 15.

Figure 16:
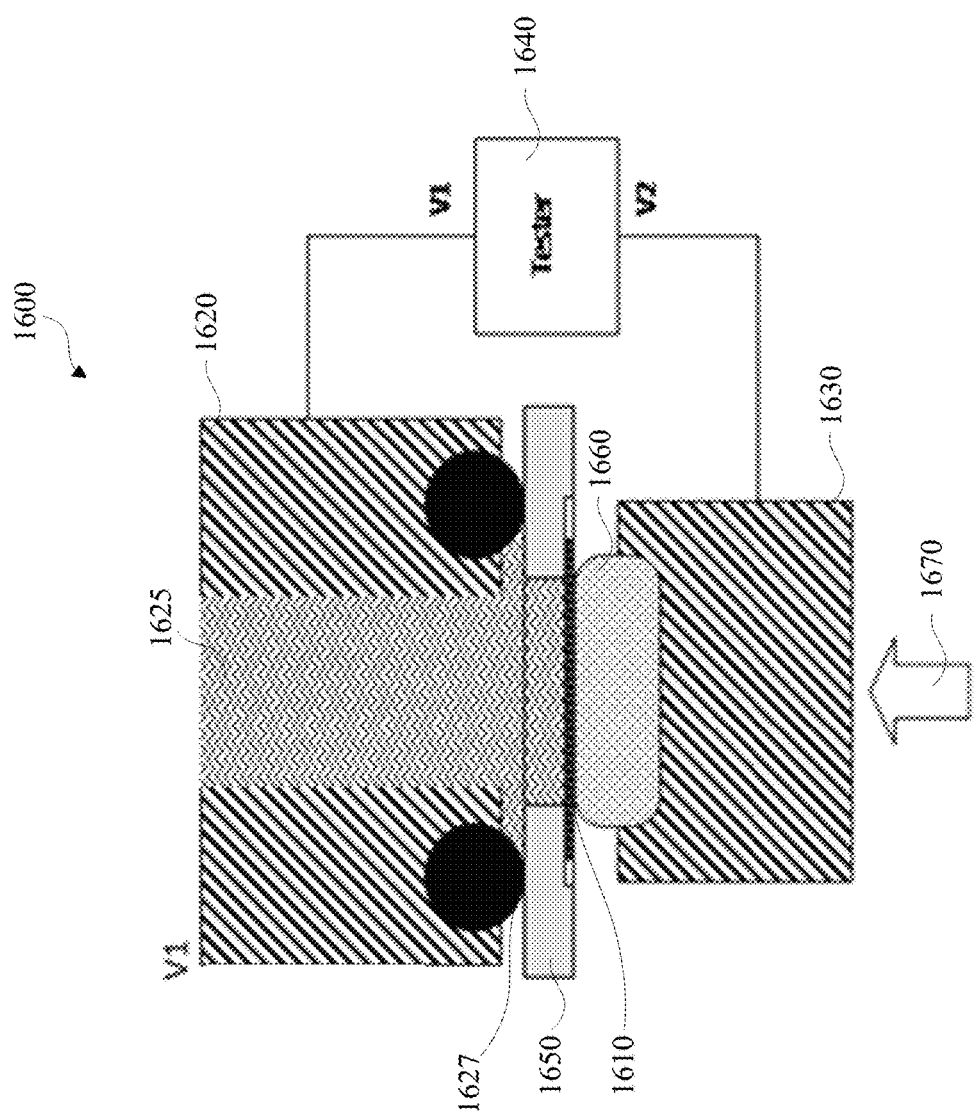
FIG. 16 is a diagram of another example of a leak test system in accordance with an embodiment.

FIG. 16 is a diagram of another example of a leak test system 1600 in accordance with an embodiment. As shown in FIG. 16, the leak test system 1600 may be configured to test a breathable membrane 1610. The breathable membrane 1610 may be a gas permeable membrane. The breathable membrane 1610 may be impervious to liquids. An example of the breathable membrane 1610 may be a GORE-TEX® material.

The leak test system 1600 includes a first electrode 1620 and a second electrode 1630. The first electrode 1620 may have a first voltage V1, and the second electrode 1630 may have a second voltage V2. The first electrode 1620 may form a chamber 1625. The chamber 1625 may be configured to hold a liquid, for example, water. The first electrode 1620 may include a seal portion 1627 to prevent leakage of the liquid from the chamber 1625.

The first electrode 1620 and the second electrode 1630 are electrically coupled to a tester 1640. The tester 1640 may be configured to measure current to detect a defect in the breathable membrane 1610. A defect may include an opening that allows the passage of electrons through the opening. The number of electrons that pass through the opening may be correlated with the size of the opening. For example, a large opening may allow for a greater number of electrons to pass through than a smaller opening.

The leak test system 1600 includes a supporting portion 1650. The supporting portion 1650 may be an insulating material. The supporting portion 1650 may form a seal with the seal portion 1627 to prevent leakage of the liquid from the chamber 1625. Portions of the first electrode 1620, the seal member 1627, and the supporting portion 1650 may form the chamber 1625.

The leak test system 1600 includes a conductive foam 1660. The conductive foam 1660 is coupled to the second electrode 1630 and is configured to contact the breathable membrane 1610 when a force 1670 is applied to the second electrode 1630.

A method may be used to test a sealed pouch battery or any similar liquid or gel filled component for leaks where the battery may be placed in a test chamber that includes soft contact electrodes, for example a conductive foam, and hard ionization electrodes. With the chamber being closed and with the battery inside the chamber, regulated air or any other inert gas may be used to pressurize the chamber. The pressurization of the chamber may cause electrolyte to leak out of the battery. A UV lamp may be used inside the chamber to initiate the ionization of the air. The air pressure may be exhausted, and a regulated vacuum may then be applied to the test chamber. In an example, the UV lamp and the vacuum may be applied simultaneously. The UV lamp may be in the line of sight of the hard electrode and the battery. A first voltage may be applied to the soft contact electrode of the test fixture. The same voltage may be applied to the hard non-contact electrode. A leak current measurement may then be performed. In an example, another voltage may be applied to both the soft contact electrode and the hard non-contact electrode. This voltage may be the same voltage as the previous step. A leak current measurement may be made on the hard non-contact electrode. A pass or fail determination may be made based on the leak current measurement results. All the electrodes may then be contacted to ground to remove any static electricity. The UV lamp may then be turned off, and the test chamber may be filled with atmospheric air prior to opening and removal of the battery. A carbon fiber brush (or any other soft conductive material) may be connected to the ground to remove static electricity prior to removal of the battery. The voltages applied may be DC, AC, or voltage spikes associated with a constant voltage.

While the invention has been described in connection with certain embodiments, it is to be understood that the invention is not to be limited to the disclosed embodiments but, on the contrary, is intended to cover various modifications, combinations, and equivalent arrangements included within the scope of the appended claims, which scope is to be accorded the broadest interpretation so as to encompass all such modifications and equivalent structures as is permitted under the law. One or more elements of the embodiments disclosed may be combined with one or more elements of any other embodiment disclosed.

What is claimed is:

1. A leak test instrument comprising:
   at least one power source configured to apply a voltage to one or more electrodes;
   a current measuring device configured to measure current on at least one electrode in order to detect a leak; and
   an insulator positioned between the one or more electrodes connected to the power source and the at least one electrode from which the current is measured, wherein the at least one electrode is positioned and extends through the insulator for the measurement of the current.

2. The leak test instrument of claim 1, wherein at least one of the electrodes is not in contact with a part under test.

3. The leak test instrument of claim 1, wherein at least one of the electrodes is in contact with a part under test by a conductive element.

4. The leak test instrument of claim 3, wherein the conductive element comprises an elastic part.

5. The leak test instrument of claim 3, wherein the conductive element is at least one of a conductive foam or a spring.

6. The leak testing device of claim 3, wherein the conductive element is configured to hold the part under test in a housing.

7. The leak test instrument of claim 1, further comprising:
   a pressure source configured to apply a pressure to a part under test located in a test chamber prior to a testing sequence, wherein the pressure source is at least one of a pressure regulator or a device applying a mechanical force on the part under test.

8. The leak test instrument of claim 1, further comprising:
   a vacuum pump and at least one valve that is configured to apply a negative pressure to a test chamber during a testing sequence, wherein the negative pressure is applied to aid propagation of ions between the one or more electrodes and a part under test.

9. The leak test instrument of claim 1 wherein one of the one or more electrodes is under a first tension, wherein an additional conductive portion is under a second tension substantially equal to the first tension of the one or more electrodes.

10. The leak test instrument of claim 1 further comprising an ultraviolet (UV) lamp configured to radiate between the one or more electrodes and a part under test.

11. The leak test instrument of claim 1, wherein a part under test is an electric storage device or an insulated film.

12. The leak test instrument of claim 11 wherein the electric storage device comprises a battery.

13. The leak test instrument of claim 1 operable to test for leaks on a part under test, the leak test instrument further comprising:
    an enclosure defining an inner chamber operable to position and selectively enclose the part under test, wherein the one or more electrodes extends into the inner chamber proximate the part under test, the at least one electrode extends to an exterior of the enclosure through the insulator.

14. The leak test instrument of claim 13 further comprising a conductive element in electric communication with the power source, the conductive element in selective contact with an outer surface of the part under test when the part under test is enclosed by the enclosure.

15. The leak test instrument of claim 14 wherein the one or more electrodes in electric communication with the power source comprises one or more first electrodes in electric communication with a first power source, the enclosure further comprising:
    a second electrode in electric communication with a second power source different than the first power source, the second electrode not in contact with the conductive element and operable to prevent a flow of electrical current from traveling from the conductive element through the air directly to the at least one electrode from which the current is measured.

16. The leak test instrument of claim 13 wherein the enclosure further comprises:
    a base; and
    a lid connected to the base, the base and the lid defining the inner chamber.

17. The leak test instrument of claim 13 wherein the enclosure further comprises a test fixture.

18. A leak testing method comprising:
    applying a first voltage to a first electrode in electric communication with a first power source;
    positioning the first electrode in proximity to an outer surface of a part under test;
    extending at least one of a cable or a part under test electrode in electrical communication with the part under test through an insulator;
    connecting in electrical communication the at least one of the cable or part under test electrode to a ground;
    measuring a current on the at least one cable or part under test electrode; and
    determining one of a defect or non-defect of the part under test based on the current measurement of the at least one of the cable or the part under test electrode.

19. The leak testing method of claim 18 further comprising placing the first electrode in contact with the part under test outer surface by a conductive element.

20. The leak testing method of claim 18, further comprising applying ultraviolet (UV) light between the first electrode and the part under test.

21. The leak testing method of claim 18, further comprising contacting the first electrode and a second electrodes to ground to remove static electricity.

22. The leak testing method of claim 18 further comprising placing the part under test in an inner chamber defined by an enclosure, the at least one of the cable or part under test electrode extending through the insulator to an exterior of the enclosure.

23. The leak testing method of claim 22 further comprising applying a second voltage to a second electrode in electric communication with a second power source different than the first power source, wherein the second electrode is not in contact with the part under test, the second voltage operable to prevent a flow of electrical current from traveling from the first electrode through the air directly to the at least one of the cable or the part under test electrode.

24. The leak testing method of claim 18 further comprising electrically connecting the at least one cable or part under test electrode to a metal contact, the metal contact in electrical communication with a ground.

25. A leak test instrument operable to test for leaks on a breathable membrane, the leak test instrument comprising:
   a first electrode connected to a power supply, the power supply operable to apply a first voltage, the first electrode defining a chamber operable hold a fluid;
   a seal engaged with the first electrode;
   an insulating supporting portion in sealing engagement with the seal, the insulating support portion defining a through hole in fluid communication with the first electrode chamber, the through hole in communication with a breathable test membrane;
   a second electrode connected to the power supply and positioned on an opposite side of the breathable test membrane from the first electrode;
   a conductive material in engagement with the second electrode, the conductive material and second electrode movable to selectively place the conductive material in abutting engagement with the breathable test membrane; and
   a tester in electrical communication with the first and the second electrode operable to measure an electrical current between the first and the second electrode operable to detect a defect in the breathable membrane.

26. The leak test instrument of claim 25, wherein the breathable membrane is gas permeable.

27. The leak test instrument of claim 25, wherein the breathable membrane is impervious to liquid.

28. The leak test instrument of claim 25 wherein the conductive material comprises a conductive foam.

29. A leak test instrument comprising:
   at least one power source configured to apply a voltage to one or more electrodes;
   an insulating portion that is configured to allow a cable or an electrode of a part under test to pass through;
   a metal contact configured to be electrically coupled to the cable or the electrode under testing conditions and a ground; and
   a current measuring device configured to measure current on at least one electrode in order to detect a leak.

30. The leak testing device of claim 29, wherein the insulating portion is comprised of at least one of rubber or a non-conductive material that provides greater insulation than air.

* * * * *